(12) United States Patent
Elmegreen et al.

(10) Patent No.: US 8,159,854 B2
(45) Date of Patent: Apr. 17, 2012

(54) PIEZO-EFFECT TRANSISTOR DEVICE AND APPLICATIONS

(75) Inventors: Bruce G. Elmegreen, Yorktown Heights, NY (US); Lia Krusin-Elbaum, Yorktown Heights, NY (US); Glenn J. Martyna, Yorktown Heights, NY (US); Xiao Hu Liu, Yorktown Heights, NY (US); Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 12/495,027

(22) Filed: Jun. 30, 2009

(65) Prior Publication Data

US 2010/0328984 A1  Dec. 30, 2010

(51) Int. Cl.
   *G11C 5/06* (2006.01)
(52) U.S. Cl. .................................. 365/72; 365/177
(58) Field of Classification Search .......... 365/72, 365/177; 257/414
   See application file for complete search history.

(56) References Cited

U.S. PATENT DOCUMENTS

| | | |
|---|---|---|
| 3,138,726 A | 6/1964 | Samuelson |
| 4,419,598 A | 12/1983 | Spitz et al. |
| 5,231,326 A | 7/1993 | Echols |
| 5,760,675 A | 6/1998 | Lee et al. |
| 5,872,372 A | 2/1999 | Lee et al. |
| 5,883,419 A | 3/1999 | Lee et al. |
| 6,392,934 B1 | 5/2002 | Saluel et al. |
| 7,221,579 B2 | 5/2007 | Krusin-Elbaum et al. |
| 7,253,488 B2 * | 8/2007 | Zhan et al. ................ 257/414 |
| 7,394,089 B2 | 7/2008 | Doyle et al. |
| 7,411,818 B1 | 8/2008 | Elmegreen et al. |
| 2006/0054926 A1 | 3/2006 | Lahreche |
| 2007/0235784 A1 | 10/2007 | Krusin-Elbaum et al. |
| 2009/0026890 A1 | 1/2009 | Goat et al. |

OTHER PUBLICATIONS

Ju. H. Krieger, "Acousto-Ferroelectric RAM—New Type of Nonvolatile Memory Device," IEEE, pp. 53-55, 2007.
Hidekuni Takao et al., "Stress-Sensitive Differential Amplifiers Using Piezoresistive Effects of MOSFETs and Their Application to Three-Axial Accelerometers," Elsevier, Sensors and Actuators—A Physical; 65; pp. 61-68; 1998.
B.S. Kang et al.; "Pressure-induced changes in the conductivity of AlGaN/GaN high-electron mobility-transistor membranes;" Applied Physics Letters, vol. 85, No. 14, Oct. 4, 2004; pp. 2962-2964.
F.F.C. Duval et al.; "High Frequency PZT Composite Thick Film Resonators;" Integrated Ferroelectrics, 63, 2004; pp. 27-33.
A. Husmann et al.; "Dynamical Signature of the Mott-Hubbard Transition in Ni(S,Se)2," Science, vol. 274; Dec. 13, 1996; pp. 1874-1876.

(Continued)

*Primary Examiner* — Son Dinh
(74) *Attorney, Agent, or Firm* — Cantor Colburn LLP; Vazken Alexanian

(57) ABSTRACT

A piezo-effect transistor (PET) device includes a piezoelectric (PE) material disposed between first and second electrodes; and a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

32 Claims, 19 Drawing Sheets

OTHER PUBLICATIONS

A. Jayaraman et al.; "Continuous and Discontinuous Semiconductor-Metal Transition in Samarium Monochalcogenides Under Pressure;" Physical Review Letters, vol. 25, No. 20; Nov. 16, 1970; pp. 1430-1433.

G. Krill et al.; "Physical Properties of Compounds NiS2-xSex with Pyrite Structure: Metal-Non Metal Transition, Evidence of the Existence of an Antiferromaagnetic Metallic Phase;" Journal de Physique, vol. 10, No. 37; Oct. 1976; pp. C4-23-C427.

R. Lengsdorf et al.; "The observation of the insulator-metal transition in EuNio3 under high pressure;" Journal of Physics: Condensed Matter, 16; 2004; pp. 3355-3360.

C. Liu et al.; "Pressure-induced insulator-conductor transition in a photoconducting organic liquid-crystal film;" Letter to Nature, vol. 418; Jul. 11, 2002; pp. 162-164.

Young-Tae Kim et al.; "Study on Cell Characteristics of PRAM Using the Phase-Change Simulation;" IEEE, 2003, pp. 211-214.

S. Sriram et al.; "Measurement of high piezoelectric response of stronium-doped lead zirconate titanate thin films using a nanoindenter;" Journal of Applied Physics 101, 104910 (2007), pp. 101-105.

Stefan Lai et al.; "OUM—A 180 nm Nonvolatile Memory Cell Element Technology For Stand Alone and Embedded Applications;" IEEE, IEDM Tech Digest, 2001, pp. 803-806.

Jon Maimon et al.; "Chalcogenide-Based Non-Volatile Memory Technology;" IEEE Aerospace Conf. Proceedings, 2001, pp. 2289-2294.

Scott Tyson et al.; "Nonvolatile, High Density, High Performance Phase Change Memory;" IEEE Aerospace Conf. Proceedings, 2001, pp. 385-390.

A. Jayaraman et al.; "Continuous and Discontinous Semiconductor-Metal Transition in Samarium Monochalcogenides Under Pressure;" Physical Review Letters, vol. 25, No. 20, Nov. 16, 1970; pp. 1430-1433.

Sharath Sriram et al.; ARNAM 2007 Annual Workshop Abstract, 2007.

Arturas Ulcinas et al.; "Investigation of microstructure and piezoelectric properties of Zr- and Sm-doped PbTiO3 nanostructured thin films derived by sol-gel technology;" Sensors and Actuators B 109, 2005, pp. 97-101.

Maxim Lebedev et al.; "Effect of Thickness on the Piezoelectric Properties of Lead Zirconate Titanate Films Fabricated by Aerosol Deposition Method;" Jpn. J. Appl. Phys. vol. 41, 2002, pp. 6669-6673.

C.J. Glassbrenner et al.; "Thermal Conductivity of Silicon and Germanium from 3K to the Melting Point*;" Physical Review, vol. 134, No. 4A, May 18, 1964, pp. A1058-A1069.

S.S. Lu et al.; "Piezoelectric field effect transistor (PEFET) using In0.2Ga0.8As/AI0.35/In0.2Ga0.8As/GaAS strained layer structure on (111)B GaAs substrate;" Electronic Letters May 12, 1994 vol. 30 No. 10; pp. 823-825.

S. Sriram et al.; "The effect of post-deposition cooling rate on the orientation of piezoelectric (Pb0.92Sr0.08) (Zr0.65Ti0.35)O3 thin films deposited by RF magnetron sputtering;" Semiconductor Science and Technology 21; 2006; pp. 1236-1243.

S. Tomic et al.; "Pressure-Induced Metal-to-Insulator Phase Transitions in the Organic Conductor (2,5 DM-DCNQI) 2Cu;" Europhysics Letters, 5 (6); Mar. 15, 1988; pp. 553-558.

X. Wang et al.; "Piezoelectric Field Effect Transistor and Nanoforce Sensor Based on a Single ZnO Nanowire;" Nano Letters 2006 vol. 6, No. 12; pp. 2768-2772.

F. Xu et al.; "Longitudinal piezoelectric coefficient measurement for bulk ceramics and thin films using pneumatic pressure rig;" Journal of Applied Physics Vol. 86, No. 1, Jul. 1, 1999; pp. 588-594.

Y. Yamashita et al.; "Can relaxor piezoelectric materials outperform PZT?(Review);" IEEE; 1996; 71-78.

A. Yukikuni et al.; "Pressure induced insulator-methal transition in hexagonal BaTi03;" Journal of Physical Society of Japan; 2004; Abstract.

* cited by examiner

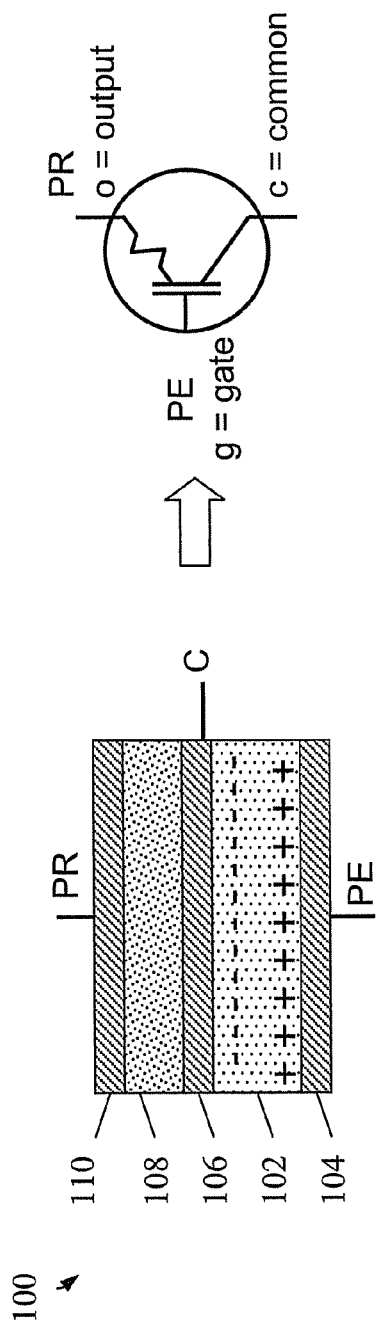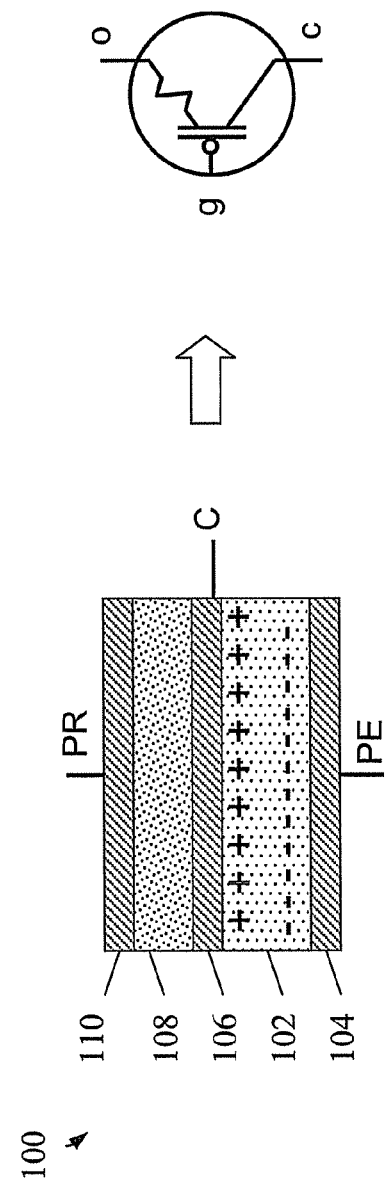
Fig. 1(a)
Fig. 1(b)

ZnODEP

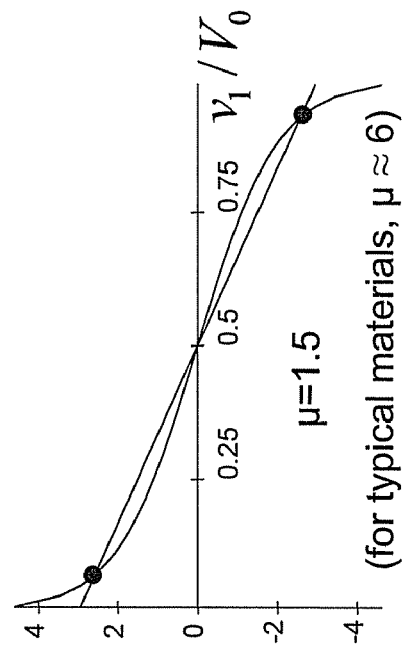
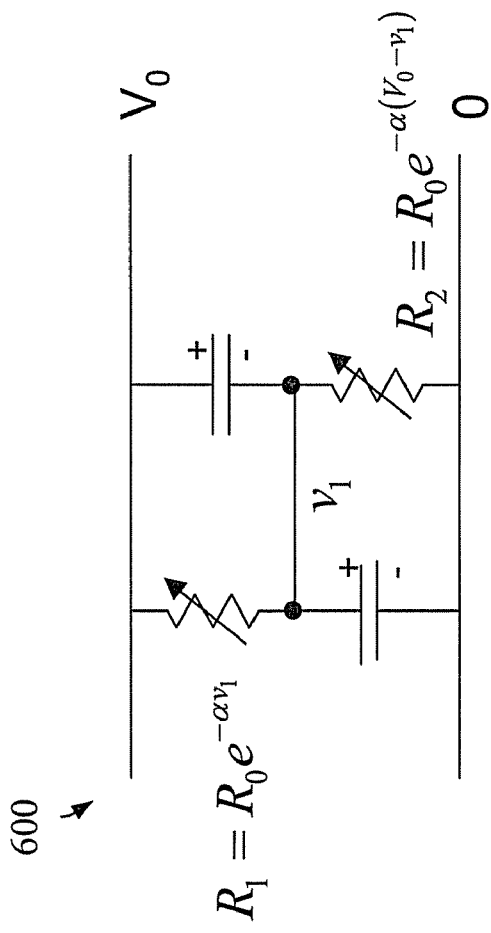
Fig. 7(a)
Fig. 7(b)

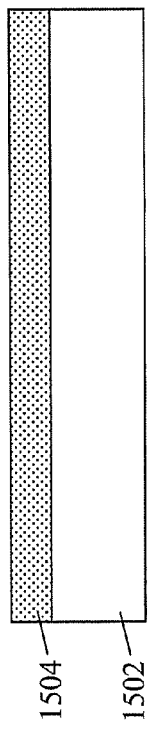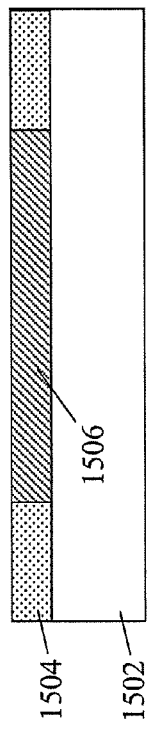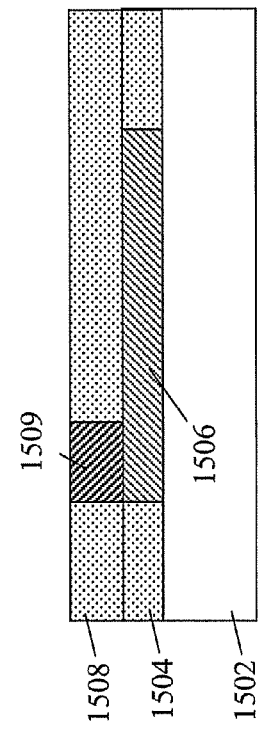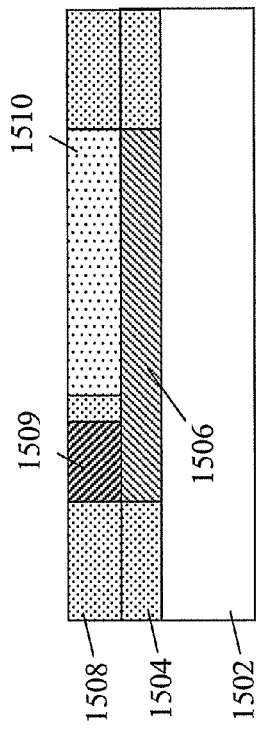
Fig. 15(a)
Fig. 15(b)
Fig. 15(c)
Fig. 15(d)

PIEZO-EFFECT TRANSISTOR DEVICE AND APPLICATIONS

BACKGROUND

The present invention relates generally to integrated circuit devices and, more particularly, to a piezo-effect transistor device and applications thereof.

Complementary Field Effect Transistors (FETs) support the standard computer architecture (CMOS) currently used in logic and memory. FETs exploit high channel mobility to control few-carrier currents electrostatically. However, limitations in this highly successful technology are appearing at current and future device scales.

More specifically, difficulties in scalability arise from short channel effects and from few-dopant fluctuation effects. The $HfO_2$ gate oxide short channel solution brings about mobility limitations which are slowing clock speeds (Moore's Law scaling becomes negative). The unfavorable FET geometry wherein the gate capacitance corresponds to gate area, but wherein current corresponds to channel width/channel length (resulting in a speed $\sim 1/L^2$), means that the FET is a relatively high impedance device. Hence undesirably large-area FETs are required in "power hungry" applications, such as programming a PCM memory, driving long wires, or shutting down power to inactive circuit blocks.

It is desirable but very complex to build multi-layer structures in CMOS, due to the need for all FETs to be formed in single crystal silicon. A new technology in which straightforward lithographic processes can build multilayer structures could open up significant new applications such as high capacity multilayer memories and combinations of logic and memory at different levels optimized to reduce wiring length.

SUMMARY

In an exemplary embodiment, a piezo-effect transistor (PET) device, includes a piezoelectric (PE) material disposed between first and second electrodes; and a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

In another embodiment, a piezo-effect, electronic memory storage element includes a first piezo-effect transistor (PET) device coupled to a second PET device in a latch configuration, with the first and second PET devices each comprising a piezoelectric (PE) material disposed between first and second electrodes, a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

In another embodiment, a digital logic gate includes two or more piezo-effect transistor (PET) devices each comprising a piezoelectric (PE) material disposed between first and second electrodes, a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

In still another embodiment, a method of forming a piezo-effect transistor (PET) device includes forming a first electrode; forming a piezoelectric (PE) material over the first electrode; forming a second electrode over the PE material; forming a piezoresistive (PR) material over the second electrode; and forming a third electrode over the PR material; wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

BRIEF DESCRIPTION OF THE SEVERAL VIEWS OF THE DRAWINGS

Referring to the exemplary drawings wherein like elements are numbered alike in the several Figures:

FIGS. 1(a) and 1(b) are schematic diagrams of a PET device shown in an n-type configuration and a p-type configuration, respectively, along with a three-terminal symbolic representation thereof;

FIGS. 7(a) and 7(b) are schematic diagrams illustrating the bistability of a PET-based flip-flop device, such as shown in FIGS. 6(a) and 6(b);

FIGS. 15(a) through 15(h) are cross sectional views illustrating an exemplary method of forming a PET device.

DETAILED DESCRIPTION

Figure 2:
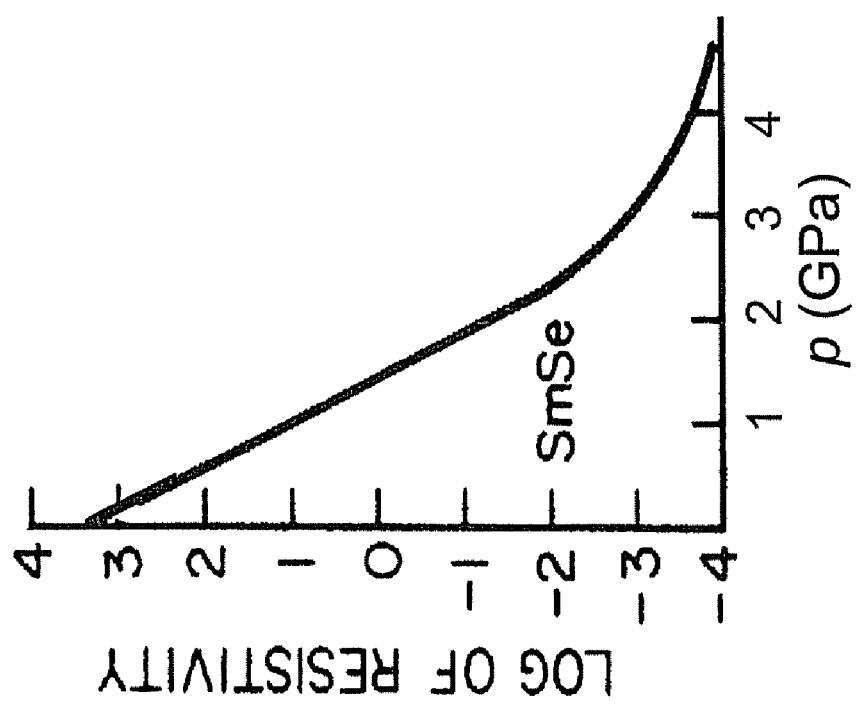
FIG. 2 is a graph that illustrates pressure versus resistance properties of samarium selenide (SmSe)

Disclosed herein is a piezo-effect transistor device and applications thereof that provide a novel solution to fast, lithography-capable and scalable switching needs. The embodiments disclosed herein arise from the observation that good channel conductance should be obtainable from high carrier density materials, even if the carriers do not have high mobility. This is especially true if the current flow were transverse to the device plane, thus escaping from the unfavorable FET geometry. Because certain materials of this type are pressure sensitive, i.e., piezoresistive (PR), their conducting behavior can thus be controlled via pressure produced by a voltage-controlled piezoelectric (PE) element.

A piezoelectric (PE) material either expands or contracts, depending on the polarity of the voltage applied across it. A piezoresistive (PR) material has a high or low resistance depending on its compression. As described in further detail herein, the juxtaposition of a PE material and a PR material in a way that allows the expansion and contraction of the PE material to compress and decompress the PR material results in a sensitive switch in which the resistance in the PR material can be controlled by varying the voltage across the PE material. More specifically, a three-terminal device, with one terminal connected to a thin metallic layer between the PE and PR, another to the far side of the PE and a third to the far side of the PR forms a transistor-like switch that may be used for logic and memory functionalities. Hereinafter, such a device is referred to as a Piezo-Effect Transistor or PET.

Referring now to FIGS. 1(a) and 1(b), there is shown a schematic diagram of a PET device 100 shown in an n-type configuration and a p-type configuration, respectively, along with a three-terminal symbolic representation thereof. The PET device 100 is characterized by a sandwich structure (FIG. 1), in which a PE material 102 is sandwiched between a pair of electrodes, a first of which represents a PE electrode 104 or "gate" (control) terminal and a second of which represents a common electrode 106. In addition, a PR material 108 is sandwiched between the common electrode 106 and a third electrode, which represents an output electrode 110.

In the three-terminal, 5-layered PET device 100 shown in FIGS. 1(a) and 1(b), the output electrode 110 comprises a metal layer (e.g., about 10-20 nanometers (nm) in thickness) that acts as a conductor through which significant current can be passed only if the PR material 108 is in the "ON" or low resistance state. The common electrode 106 comprises another metal layer, which is moderately flexible so as to transmit the pressure applied by the PE material 102 therebeneath. This middle metal layer acts as the common terminal for the transistor. The PE electrode or gate electrode 104 comprises another metal layer (e.g., about 10-20 nm in thickness) through which a programming voltage is applied to the PE layer 102. Thus, in the conductor/PE/conductor/PR/conductor sandwich structure, each conductor electrode also provides a barrier layer against diffusion of the PE/PR materials. As also shown in FIGS. 1(a) and 1(b), the +/− indications depict the piezo polarization to be applied to the PE layer 102 in order for the PR layer 108 to be in the low resistance "ON" state, assuming that the PR conductance increases with pressure. The sign of the response of the PE layer to a voltage across it (expansion or contraction) is set in a poling step during processing. With respect to the formation of an n-type PET (FIG. 1(a)) versus a p-type PET (FIG. 1(b)), the drive polarity is reversed by reversing the poling of the piezoelectric.

In total, an exemplary height of the PET device 100 is about 35-120 nm, with dimensions of about 45-90 nm in the x-y plane. Furthermore, the PET device 100 is scalable and many of the problems associated with conventional FET scaling are absent. For example, carrier transport is enhanced by the favorable geometry of the PET, in that current flows transversely through the thin channel film (instead of longitudinally as in the FET). In addition, there are no short-channel effects, as the input is screened from the output by the common electrode. Because the PET does not have a dopant nonuniformity problem, it should be less impurity/geometry sensitive than FETs, due to short mean free paths and efficient screening by the high density of carriers. The PET should have theoretically similar performance to that of FETs (as described in more detail below), and is capable of low ON impedance at very small scales.

Piezoelectric (PE) and Piezoresistive (PR) Materials

Figure 3A:
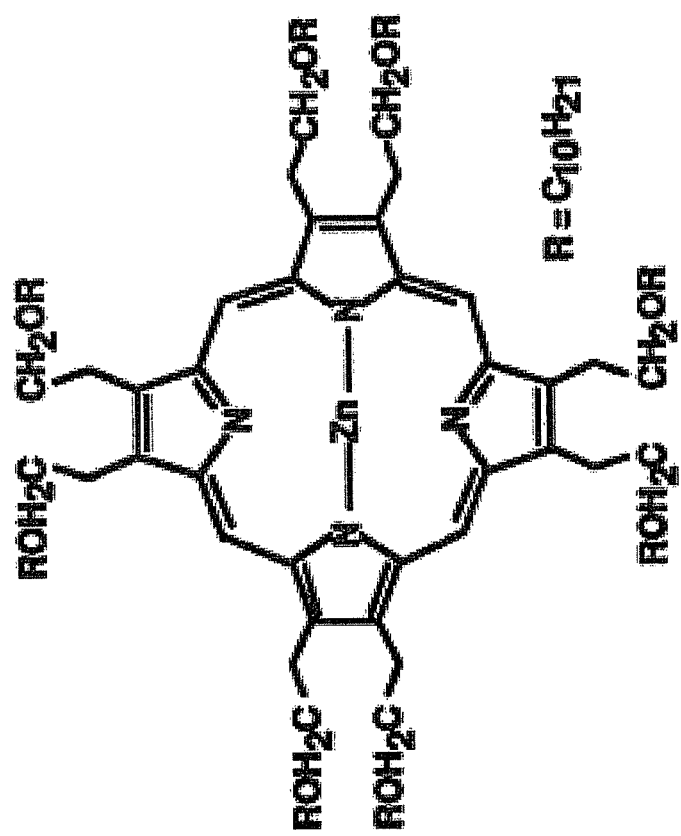
FIG. 3(a) illustrates the molecular structure of a photoconductive, porphyrin derivative known as ZnODEP.
Figure 3B:
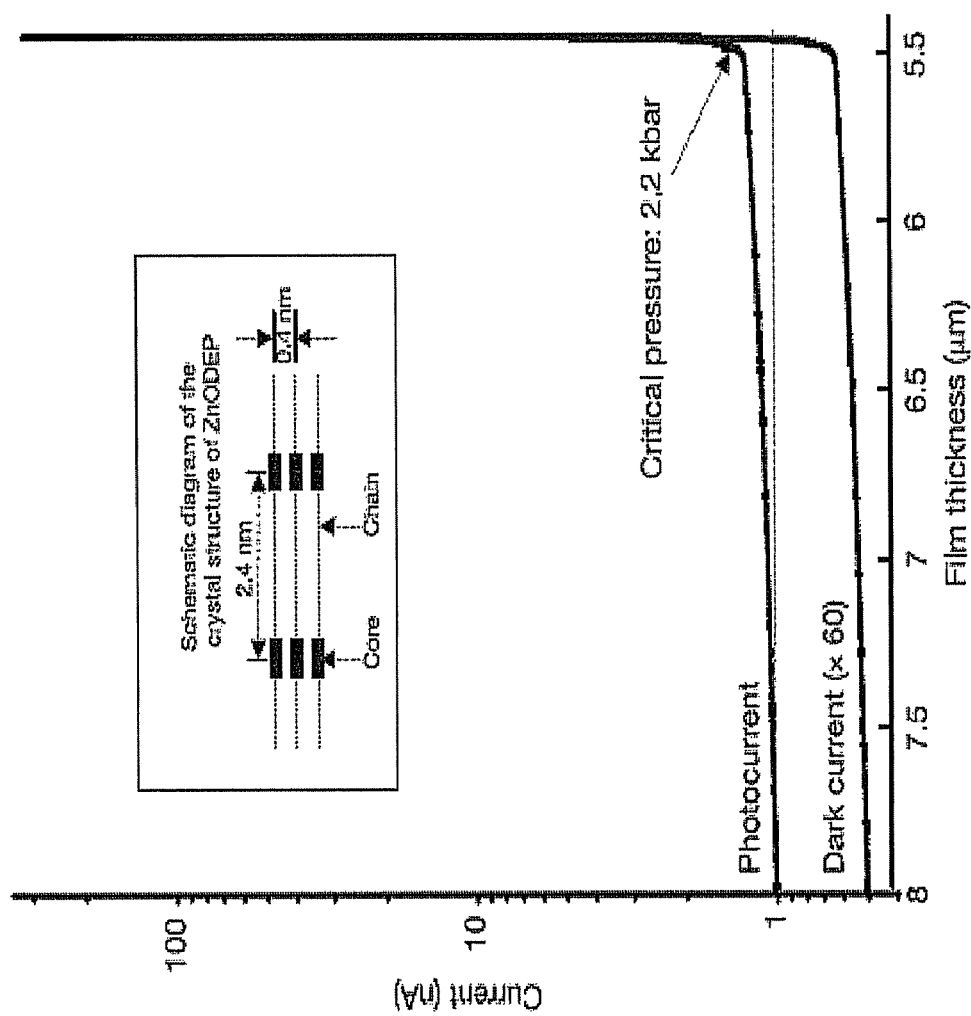
FIG. 3(b) is a graph illustrating photocurrent as a function of distance during the compression of a ZnODEP film.

FIG. 2 is a graph that illustrates pressure versus resistance properties of samarium selenide (SmSe), which is one suitable example of a PR material that may be used in the PET device. As can be seen, SmSe is a semiconductor at ordinary pressures, and continuously converts to a metallic phase under pressures of about 4 GPa, and with a substantially large conductivity change (about 5 orders of magnitude) even at about 2 GPa. While the present invention embodiments may advantageously exploit the continuous conductivity change versus pressure of materials of the SmSe type, it is also contemplated that discontinuous transition materials can also be used for the PR layer in PET device. An example of the latter type is shown in FIG. 3(a), which illustrates the molecular structure of a photoconductive, porphyrin derivative known as ZnODEP. FIG. 3(b) is a graph illustrating photocurrent as a function of distance during the compression of a ZnODEP film.

The use of continuous transition materials, such as SmSe are expected to pressurize reversibly and their transition speed may be controlled essentially by the velocity of sound, while their materials degradation due to cycling should be minimal. However, the use of materials with a discontinuous transition is also expected to be effective. Still other examples of possible PR materials that experience an insulator-to-metal transition under applied pressure include, but are not limited to: $EuNiO_3$, $Ni(S,Se)$, hexagonal $BaTiO_{3-\delta}$, InSb, and $(2,5$ $DM-DCNQI)_2Cu$.

With respect to suitable PE materials contemplated for use in the disclosed PET device embodiments, well-known piezoelectric materials include, for example lead-zirconate-titanate (PZT), strontium-doped lead-zirconate-titanate (PSZT), PSN—PMN—PNN—PSZT, PZNT 91/9 and PMNT 70/30 [Y. J. Yamashita and Y. Hosono, Jap. J. Appl. Phys. 43, 6679-6682 (2004)] with piezoelectric coefficients ($d_{33}$) lying in the range of about 200-1500 pm/V.

Figure 4:
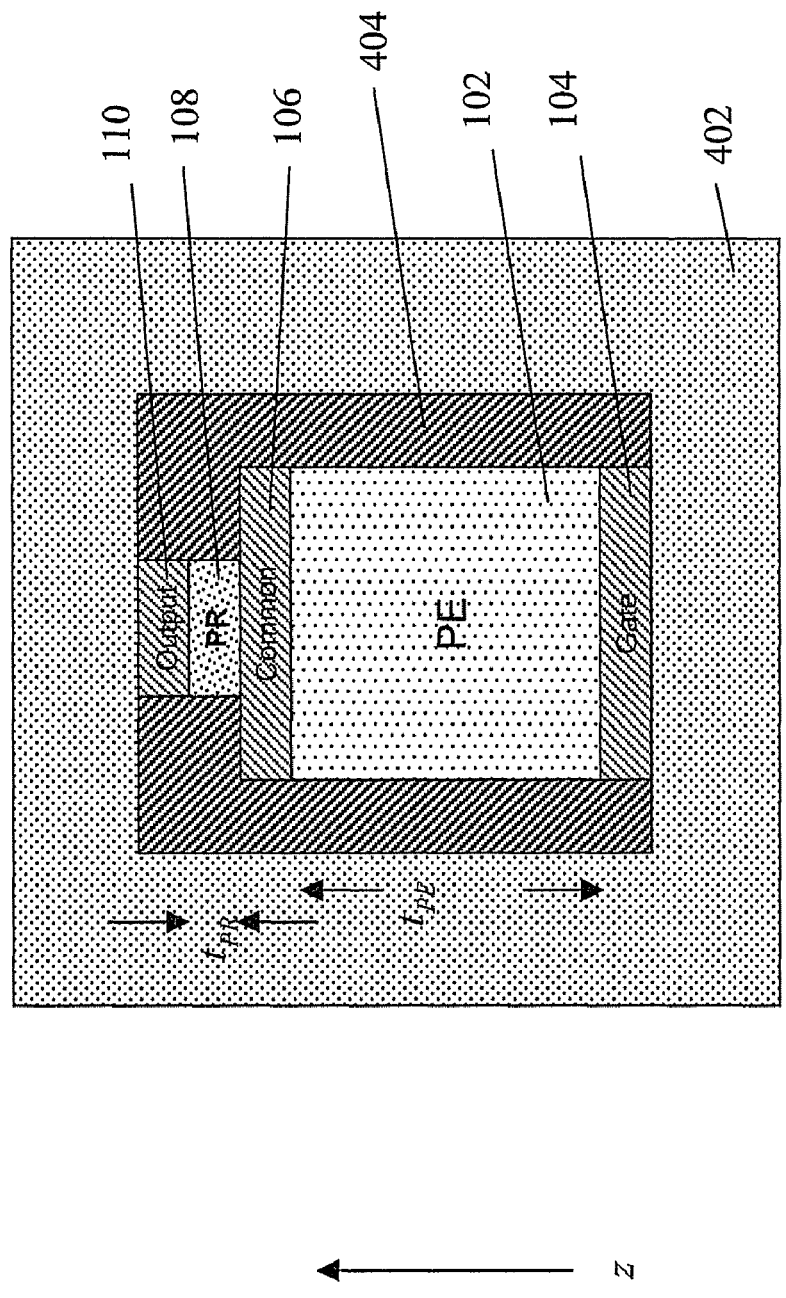
FIG. 4 is a schematic cross-sectional diagram of another embodiment of a PET device.

Referring now to FIG. 4, there is shown a schematic cross-sectional diagram of another embodiment of a PET device 400. It will be noted that the cross-sectional area of the PR element 108 is less than that of the PE element 102. In addition, the transistor cell is surrounded by a high-yield strength medium 402, such as silicon nitride (SiN), for example, to ensure that the piezoelectric displacement is transmitted to the piezoresistor, rather than to the surrounding medium. The soft spacer material 404, such as SiCOH for example, does not play a mechanically essential role.

Considering for simplicity only the z-component of electric field and stress/strain, and assuming rigid mounting of the top and bottom surfaces of the device 400 in FIG. 4, then the pressure rise $p_{PR}$ across the PR element 108 due to a field $E_z$ across the PE element 102 in the z-direction is given by the expression:

$$p_{PR} = \frac{E_z d_{33}}{\left[\frac{A_{PR}}{A_{PE}E_{PE}} + \frac{t_{PR}}{t_{PE}E_{PR}}\right]},$$

wherein E denotes the Young's modulus of the given element ($E_{PR}$ or $E_{PE}$), t denotes film thickness of the given element ($t_{PR}$ or $t_{PE}$) parallel to the z-axis, A denotes surface area of the given element ($A_{PR}$ or $A_{PE}$) normal to the z-axis, and $d_{33}$ denotes the zz-component of the piezoelectric coupling coefficient of the PE material. Using exemplary values of $E_{PR}=E_{PE}\approx 40$ GPa, $t_{PR}/t_{PE}\approx 1/5$, an area ratio $A_{PR}/A_{PE}\approx 1/4$, $d_{33}=0.6$ nm/V, and a reasonable electric field of 0.02 V/nm, the pressure rise is about 1 GPa. The applied voltage will be about 1 volt, with a PE thickness of $t_{PE}=50$ nm. As will be seen from the more detailed simulations discussed below, 0.6 GPa may be reached (drive voltage 1.6 V), using a piezoelectric with $d_{33}=0.37$ nm/V, which will scale up to 1.5 GPa using a PE material such as PSN—PMN—PNN—PSZT with $d_{33}=0.94$ nm/V. In contrast, using an organic PR material such as ZnODEP, only pressures on the order of about 0.22 GPa are needed, and low-power operation at drive voltages as low as 0.24 V is possible.

Speed of Response in PET Devices Compared to FET Devices

The intrinsic rate of response in PE films to voltage change depends on the piezo resonance frequency, which is comparable to the sound crossing rate in the film. Although data is difficult to find at the required high GHz frequencies, scaling upward from low frequency data is one possible analysis. In a publication entitled "High Frequency PZT Composite Thick Film Resonators," Integrated Ferroelectrics, 2004, Vol. 63, pp. 27-33, Duval et al. discuss a linear scaling between the piezo resonance frequency and the inverse piezo film thickness $t_{PE}$. Inputting bulk data gives 0.25 GHz for $t_{PE}=9$ micrometers (μm). Their actual data on 7 μm liquid-phase made samples are similar. If extrapolated to a device thickness that would be of interest for digital electronics, such as $t_{PE}=50$ nm, for example, then the extrapolated piezo frequency is f≈50 GHz. The characteristic time scale is $\tau=1/(2\pi f)=5$ ps. While this scale is acceptable for a digital device, it is desirable to verify the scale experimentally.

The estimated speed of sound in, for example, SmSe is about $2\times 10^5$ cm/s. For a 10 nm thick PR film, the transmission time is thus about 5 ps. Electrically, the response time can be estimated as the time for the device to charge the capacitance presented by the input of a similar device (or several such devices). It is useful to compare the response times for the FET and the PET estimated on this basis. The FET time scale $\tau_{FET}$, given usually as the time to charge one gate of another similar device, is $\tau_{FET}=2\ L^2/(\mu_S V_D)$, where $\mu_S$=mobility, $V_D$=drain voltage, and L=channel length. For the PET, $\tau_{PET}=t_{PR}\ \rho_{min}\sigma$, where $t_{PR}$=channel thickness, $\rho_{min}$=minimum PR resistivity, σ=piezo material capacitance/unit area. The ratio of the time scales is therefore:

$$\tau_{FET}/\tau_{PET}=2\ L^2/(t_{PR}\rho_{min}\sigma\mu_S V_D)\sim 1,$$

where $\rho_{min}=3\times 10^{-3}\ \Omega\cdot$cm, $t_{PR}=10$ nm, μ=200 cm²/V·s, L=50 nm; and where σ is estimated using a piezo thickness of $t_{PE}=50$ nm, and a dielectric constant of 4000. Electrically, the speeds of the silicon-based FET and the estimated speeds of the SmSe PET are seen to be comparable.

In absolute terms, the time to charge four (4) similar FET (in this case PET) gates is often used as a standard. The expression for this time constant $\tau_4$ can be written as:

$$\tau_4 \approx 4\rho_{min}\in \in_0 t_{PR}/t_{PE}\text{ seconds},$$

where $\rho_{min}$ is the minimum PR resistivity, and ∈ the dimensionless dielectric constant. If SmSe is compressed to 2.6 GPa, its resistivity goes down to $\rho_{min}\sim 3\times 10^{-3}\ \Omega\cdot$cm, giving a time constant of 0.8 ps at ∈=4000.

The sound transmission times are seen to limit the response speed of the PET device, based on the foregoing assumptions for an SmSe channel, more than the electrical times.

System Parameter Requirements

With respect to the concern of static "OFF" current of PET devices, it is noted that non-switching devices will dissipate static power due to the finite conductance of the OFF state of the PR material. Assuming a total of about $10^9$ devices on a chip, with maximum PR resistivity $\rho_{max}=3\times 10^3\ \Omega\cdot$cm, so that the resistance of a 40 nm×40 nm device with a PR thickness of 10 nm is about $2\times 10^8\Omega$, then the static chip dissipation at 1V is about 5 W, which is acceptable.

With respect to the dimensionless gain parameter of a PET device, it is assumed for the sake of simplicity that the pressure-dependence of the resistivity in the PR element takes the exponential form:

$$\rho=\rho_0\exp(-\gamma p_{PR}),$$

where $\rho_0$ is the resistivity at zero pressure, and the coefficient $\gamma=-d\ln\rho/dp_{PR}$ is determined from the slope of the curve shown in FIG. 2. The dimensionless gain parameter μ is defined as:

$$\mu = -\frac{d\ln\rho}{dp_{PR}}\frac{dp_{PR}}{dV_{gc}}V_{oc}\Box - \frac{d\ln\rho}{dp_{PR}}\frac{dp_{PR}}{dV_{gc}}\frac{V_0}{2},$$

where during switching $V_{oc}$ is typically about one half the line voltage $V_0$ and $$\frac{dp_{PR}}{dV_{gc}} = \frac{d_{33}t_{PE}^{-1}}{\left[\frac{A_{PR}}{A_{PE}E_{PE}} + \frac{t_{PR}}{t_{PE}E_{PR}}\right]},$$

in the foregoing notation. d ln $\rho/dp_{PR}\sim -5.5$ GPa$^{-1}$ for SmSe, while $dp_{PR}/dV\approx 1.5$ GPa/V with the foregoing parameters and with $d_{33}=0.94$ nm/V. A voltage of $V_0=1.7$V, is required to reach the maximum pressure $p_{PR}=2.6$ GPa, when the gain is μ=7 (the gain μ is essentially $1.15\times\log_{10}(\rho_{max}/\rho_{min})$).

With respect to ON/OFF ratio for a PR element, since the maximum resistivity is set by the static OFF current at $\rho_{max}=3\times 10^3\ \Omega\cdot$cm, and an ON resistivity of about $\rho_{min}=3\times 10^{-3}\ \Omega\cdot$cm is required for reasonable device speed, it is seen that the ON/OFF ratio needs to be about $\rho_{max}/\rho_{min}=10^6$.

Figure 5:
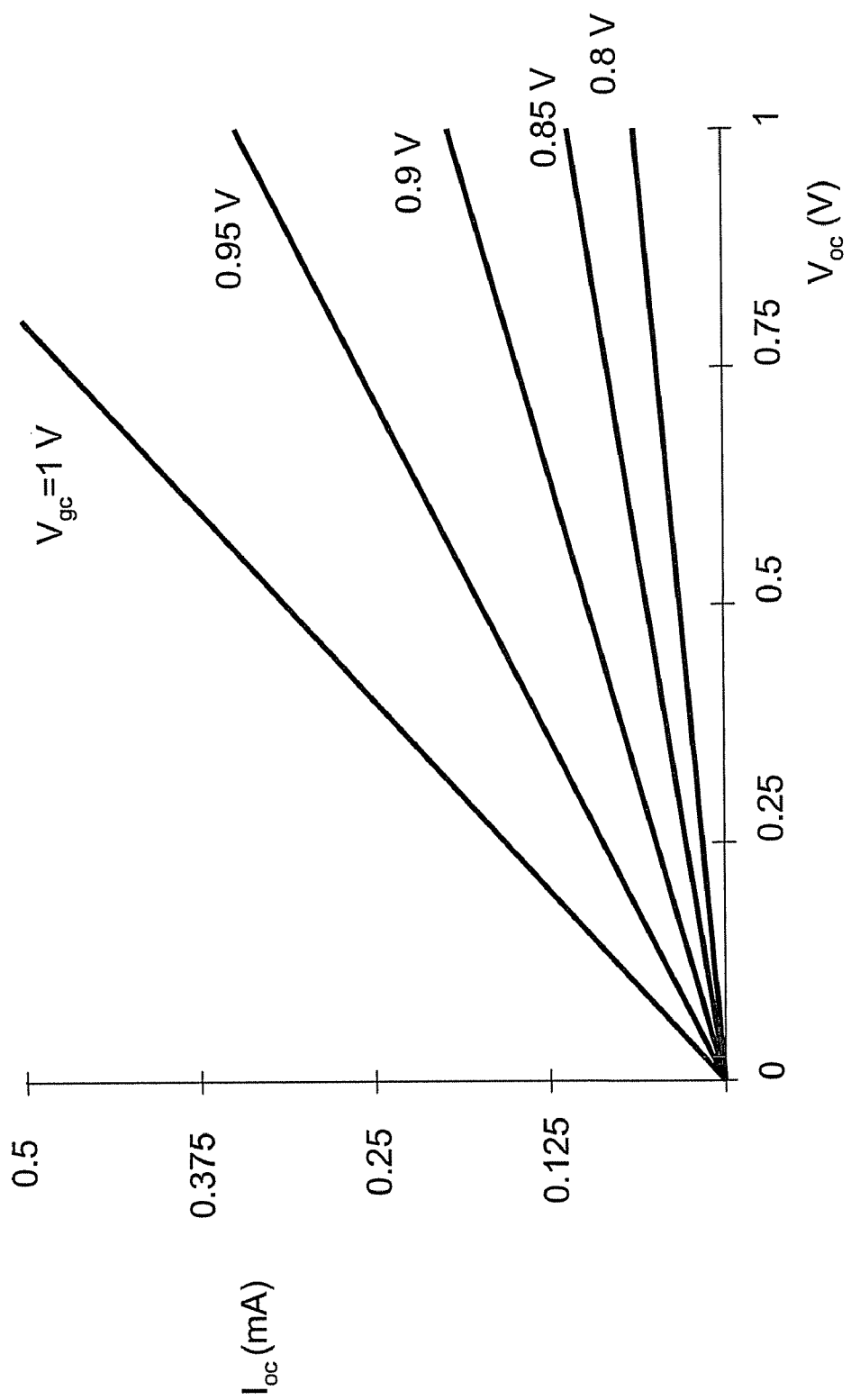
FIG. 5 is a graph that illustrates device output characteristics of a PET having an SmSe PR layer.

FIG. 5 is a graph that illustrates device output characteristics of a PET having an SmSe PR layer. As can be seen, the output current through the PR material is linear with respect to the applied voltage across the PR element at a given gate (PE) voltage. However, at a given applied gate voltage across the PR element, the output current is a strongly nonlinear function of the applied gate voltage.

Exemplary PET Device Applications

An electronic flip-flop (latch) device is generally characterized as having two stable states that can be used to serve as one bit of memory. In order to meet the condition for bistability of a flip-flop, a simple circuit analysis demonstrates that the critical region of gain for bistability is μ>1. As such, a PET device as disclosed above is a suitable building block for a flip-flop device as in the case of the SmSe based PET it is estimated that μ=7 satisfies the bistability constraint.

Figures 6A, 6B:
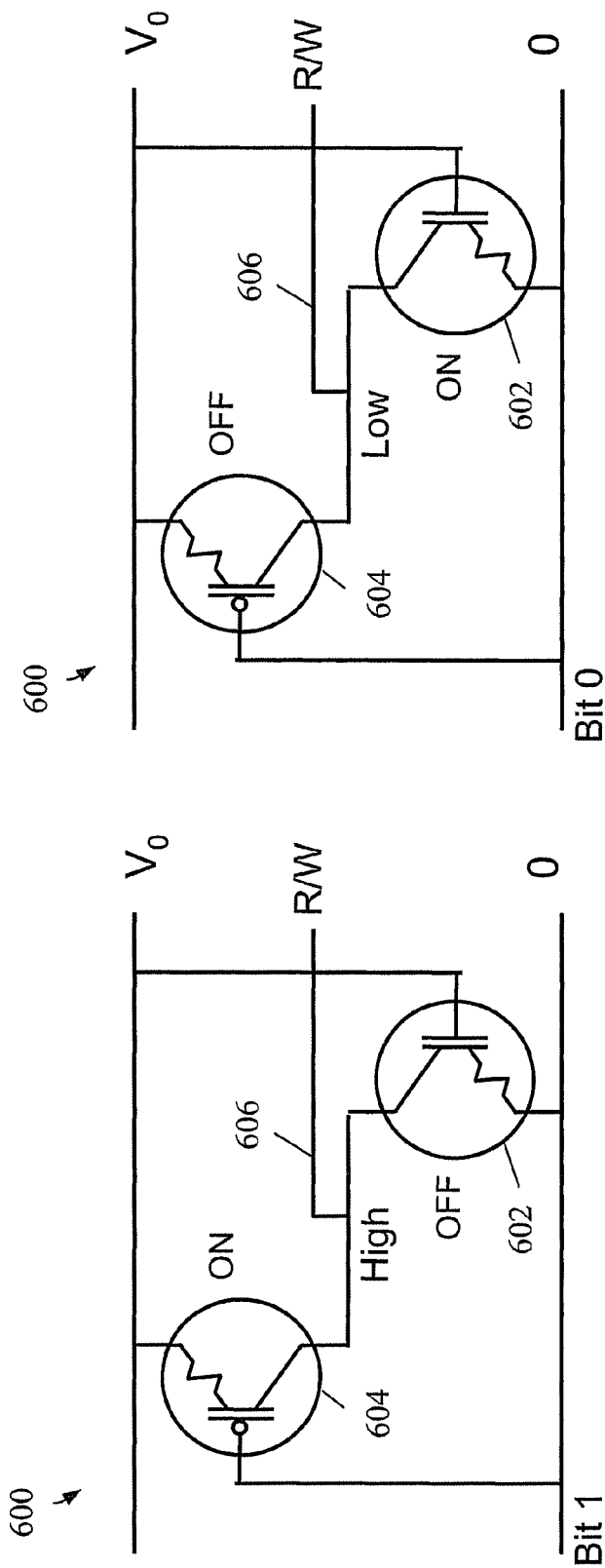
FIGS. 6(a) and 6(b) illustrate a schematic diagram of a PET-based flip-flop device, in accordance with a further embodiment of the invention.

Referring now to FIGS. 6(a) and 6(b) there is shown a schematic diagram of a PET-based flip-flop device 600, in accordance with a further embodiment of the invention. FIG. 6(a) depicts the flip-flop device 600 in a "bit 1" state, while FIG. 6(b) depicts the flip-flop device 600 in a "bit 0" state. The flip-flop device 600 includes two PET devices as discussed above, an n-type PET (or "NPET") 602 and a p-type PET (or "PPET") 604. The gate terminal (i.e., the piezoelectric electrode) of the NPET 602 is coupled to a high-side voltage supply rail ($V_0$) while the gate terminal of the PPET 604 is coupled to a low-side voltage supply rail (0). Conversely, the output terminal (i.e., the piezoresistive electrode) of the NPET 602 is coupled to the low-side voltage supply rail while the output terminal of the PPET 604 is coupled to the high-side voltage supply rail. The common terminals of the NPET 602 and PPET 604 are tied to one another, representing a read/write control or data terminal 606 for the flip-flop device 600. Thus configured, it will be noted that with respect to a conventional FET latch having cross-coupled inverters (i.e., four FET transistors), the bistable flip-flop device 600 uses only two PETs.

In operation, the PET that is in the "ON" state has a voltage (of appropriate polarity) close to $V_0$ in magnitude across its PE, while the PET that is in the "OFF" state has only a small voltage across its PE. For the Bit 1 state shown in FIG. 6(a), the voltage applied to the R/W wire is nearly as high as $V_0$ such the voltage drop across the PE portion of the PPET 604 is high, the PE is expanded and the resulting high pressure on the PR portion of the PPET gives it a low resistance. Thus, the PPET 604 is in an ON or conductive state. At the same time, the voltage drop across the PE portion of the NPET 602 is low (i.e., $V_0$ minus the voltage drop across the ON PPET 604). As a result, the PE portion of the NPET 602 is contracted and the resulting low pressure on the PR portion of the NPET 602 gives it a high resistance. Thus, the NPET 602 is in an OFF or nonconductive state. The low resistance of the ON PPET 604 combined with the high resistance of the OFF NPET 602 results in stabilizing the voltage of the commonly tied read/write control terminal 606 high.

For the Bit 0 state shown in FIG. 6(b), the voltage of the commonly tied read/write control terminal 606 is biased to low. This results in a high applied voltage across the PE portion of the NPET 602, creating pressure on the PR portion thereof and placing it into a low resistance state, allowing the NPET to maintain the read/write control terminal 606 at low potential. At the same time, the voltage across the PE portion of the PPET 604 becomes low, thus removing the pressure from its PR portion and rendering the resistance of the PPET high. That is, PPET 604 is in a stable OFF state while NPET 602 is in a stable ON state.

Accordingly, under equilibrium conditions one of the PETs is OFF while the other is ON. Because the PETs are connected in series, similar to the NFET/PFET combination of a CMOS inverter, the current drain on the supply is only that from the OFF PET. As discussed above, provided that the OFF resistivity of the PR is large enough, the resulting static power consumption will be acceptable. The electrical time constant RC, where R is the PR resistance and C the piezo gate capacitance will be ¼ of that estimated for supplying 4 gates above; i.e., 0.2 ps (assuming $\rho_{min}=3\times10^{-3}\,\Omega\cdot\text{cm}$, and a dielectric constant of 4000), which is a negligibly short time. As also indicated above, the lattice response times of the PR and PE, estimated above as a few picoseconds, dominate the switching time scale.

Bistability Condition for a Flip-Flop

FIG. 7(a) shows another schematic of PET-based flip-flop device 600, which specifically illustrates the labeling of variable resistance values $R_1$ and $R_2$, and intermediate control terminal voltage $v_1$ indicated. Considering again the model where R is exponentially dependent on pressure and therefore on voltage (as the case for the exemplary material SmSe): $R=R_0\exp(-\alpha V_{gc})$, where $\alpha=2\mu/V_0$. Thus for the PPET device, $R_1=R_0\exp(-\alpha v_1)$ and for the NPET device, $R_2=R_0\exp(-\alpha[V_0-v_1])$.

From Kirchoff's law:

$$(V_0-v_1)/v_1 = R_1/R_2 = \exp(\alpha V_0)\exp(-2\alpha v_1)$$

$$\log(V_0/v_1-1) = 2\alpha(V_0/2-v_1).$$

This is plotted at the top right portion of FIG. 7(b) for the desired case, showing 2 roots. The condition for 2 roots is:

$$\alpha>2/V_0 \text{ or } \mu>1.$$

From SmSe data, $\mu=7$, and thus the condition for bistability is satisfied.

Figure 8:
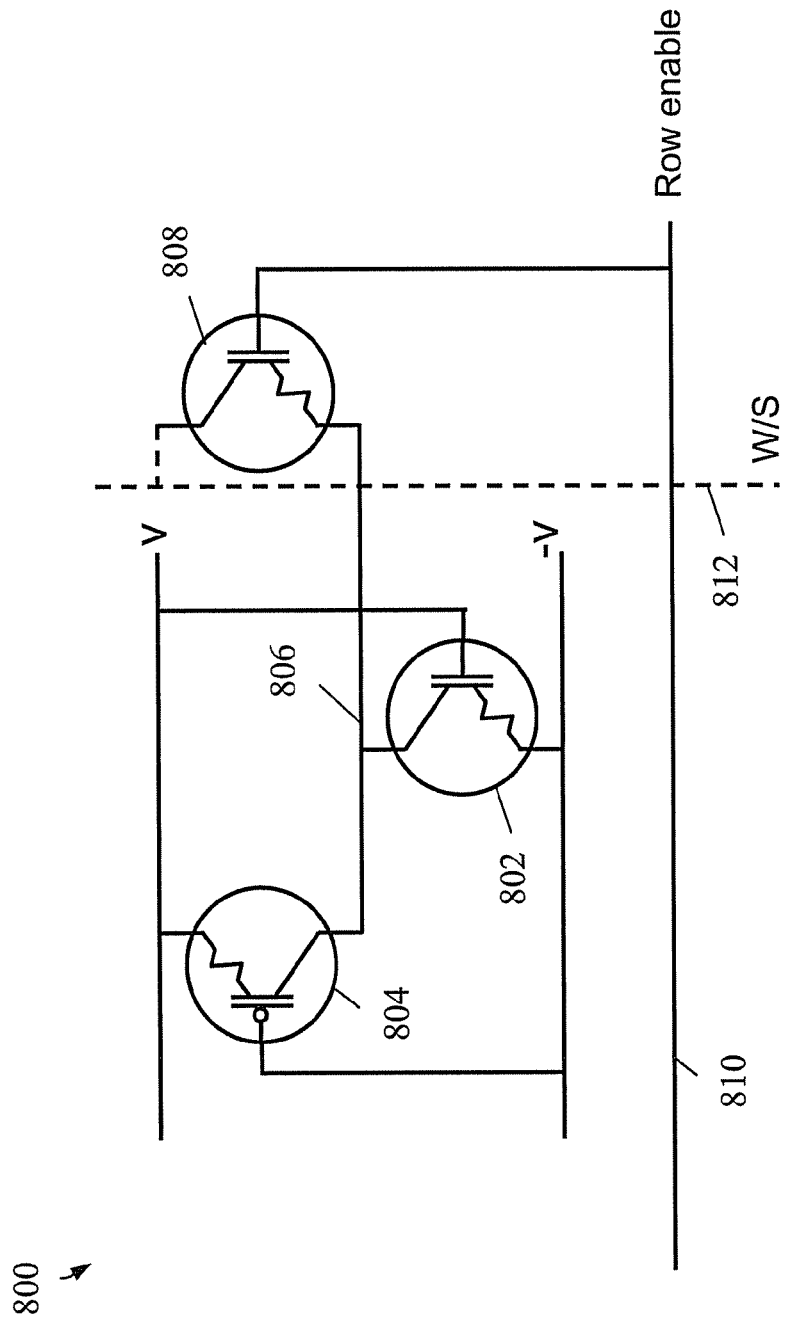
FIG. 8 is a schematic diagram of a three-transistor (3T), PET-based memory cell, in accordance with a further embodiment of the invention.

In a more practical embodiment of a bistable flip-flop memory cell, at least one additional device is desirable. An example of such a three-transistor (3T), PET-based memory cell 800 is illustrated in FIG. 8. Notably, the 3T memory cell 800 is more efficient from a device real estate standpoint than a conventional SRAM cell, which typically uses 6 transistors overall (e.g., 4 latch transistors plus 2 access transistors). Similar to the cell 600 of FIGS. 6(a) and 6(b), the 3T cell includes an NPET 802 and PPET 804 connected at a read/write control terminal 806 and configured in the manner described above. In addition, a third PET 808 (e.g., an NPET) serves as read/write device, in which the PR or output terminal of the NPET 808 is coupled to the read/write control terminal 806 and the PE or gate terminal thereof is coupled to a row enable line 810. The common terminal of the NPET 808 is coupled to a data write/sense (W/S) line 812, shown in dash in FIG. 8. As will also be noted, the voltage rail supply values in this embodiment are given as v and −v.

In operation, the 3T cell 800 is isolated whenever the row enable line 810 is at −v potential and the W/S line 812 is at zero (ground) potential, meaning that NPET 808 is OFF and the voltage at the read/write control terminal 806 is stable at either v or −v. In order to write a "0" bit into the cell, the data write/sense (W/S) line 812 is lowered to −v potential while the row enable line 810 is pulsed to a voltage of about 3 v. This turns NPET 808 strongly on and either maintains terminal 806 at −v or pulls terminal 806 from v down to −v, depending on the previous state of the cell. In a memory array, other such cells 800 coupled to the data write/sense (W/S) line 812, but in different rows, would remain stable since their respective row enable lines would remain at the low rail potential.

Conversely, to write a "1" bit into the cell 800, the data write/sense (W/S) line 812 is raised to v potential while the row enable line 810 is pulsed to a voltage of about 3 v. This also turns NPET 808 strongly on and either maintains terminal 806 at v or pulls terminal 806 from −v up to v, depending on the previous state of the cell. Finally, in order to sense or read the state of the cell 800, the data write/sense (W/S) line 812 is coupled to a sense amplifier (not shown) and grounded while the row enable line 810 is pulsed to a voltage of about 3 v. This turns NPET 808 strongly on and charges the W/S line 312 to the voltage of terminal 806, with is either at −v or v down to −v, depending on the state of the cell. Again, this operation is isolated from other cells along the same column but in different rows.

Figure 9:
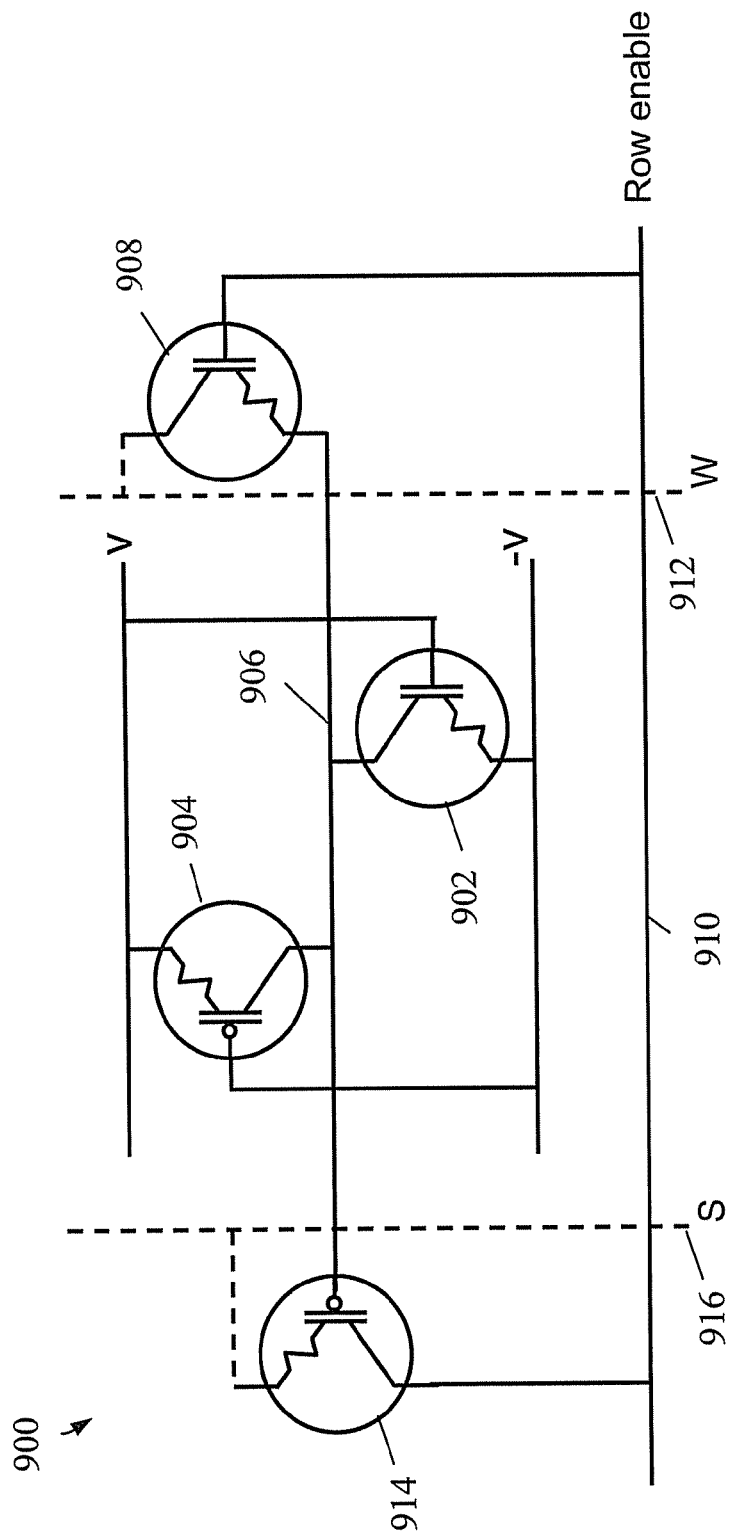
FIG. 9 is a schematic diagram of a four-transistor (4T), PET-based memory cell, in accordance with a further embodiment of the invention.

Referring now to FIG. 9, there is shown a schematic diagram of a four-transistor (4T), PET-based memory cell 900, in accordance with still a further embodiment of the invention. Similar to the embodiment of FIG. 8, the 4T cell 900 of FIG. 9 includes an NPET 902 and PPET 904 connected at a read/write control terminal 906 and configured in the manner described above. Here, however, the third PET 908 (e.g., an NPET) serves as a write device only, in which the PR or output terminal of the NPET 908 is coupled to the read/write control terminal 906 and the PE or gate terminal thereof is coupled to a row enable line 910. The common terminal of the NPET 908 is coupled to a data write (W) line 912, shown in dash in FIG. 9.

Thus, in this embodiment, the flip-flop portion of the cell does not drive a sense line directly, but instead through a fourth PET 914 (e.g., a PPET). As further shown in FIG. 9, the PR or output terminal of the NPET 908 is coupled to a data read or sense (S) line 916 (also shown in dash in FIG. 9) while the PE or gate terminal thereof is coupled to the control terminal 906. The common terminal of the PPET 914 is coupled to the row enable line 910. The design of the embodiment of FIG. 9 isolates the memory cell more efficiently, thereby promoting its stability, while still being more efficient with respect to a 6T CMOS SRAM cell.

In operation, the 4T cell 900 is isolated whenever the row enable line 910 is at −v potential and the W and S lines 912, 916 are at zero (ground) potential, meaning that both NPET 908 and PPET 914 are OFF and the voltage at the read/write control terminal 906 is stable at either v or −v. The writing of the cell 900 is similar to that of cell 800, in that the row enable line 910 is pulsed to about 3 v while either a +v or a −v voltage is applied to the data write (W) line 912. To sense the state of the cell, the write line (W) 912 is raised to +v, while the sense line (S) 916 is grounded. The row enable line 910 is only pulsed to +v in this instance. Whereas NPET 908 remains OFF, the PPET 914 will turn ON if the cell voltage at the read/write control terminal 906 is at −v. In such a case, the voltage on the sense line (S) 916 will charge up to +v. On the other hand, the PPET 914 will remain OFF if the cell voltage at the read/write control terminal 906 is at +v, in which case, the voltage on the sense line (S) 916 will remain at ground.

Other Exemplary PET Applications

Figure 10B:
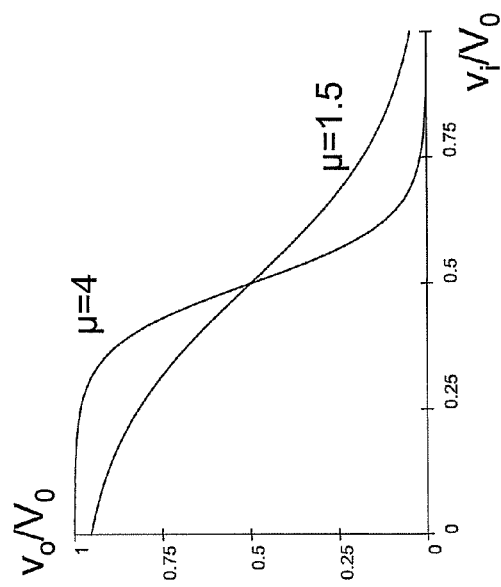
FIG. 10(b) is a graph illustrating $V_{out}/V_0$ versus $V_i/V_0$ for two values of $\mu$ of the inverter of FIG. 10(a)
Figure 10A:
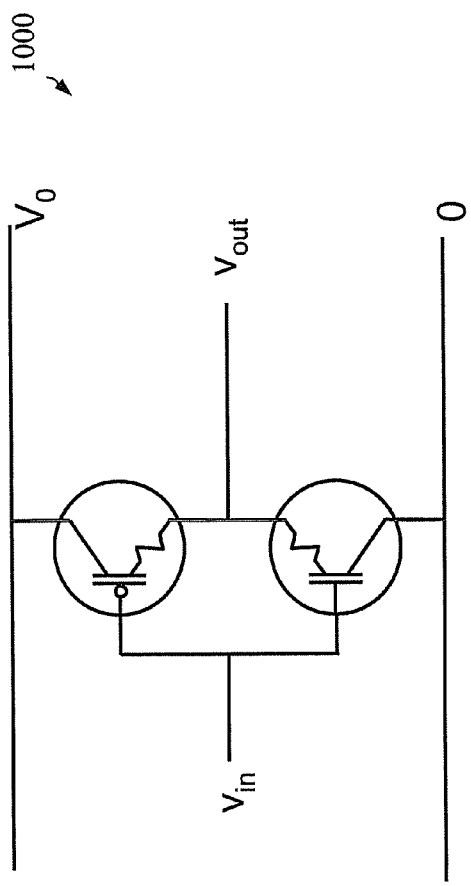
FIG. 10(a) is a schematic diagram of a PET-based inverter, in accordance with a further embodiment of the invention.

In addition to the novel circuit topologies for the above discussed bistable flip flop, 3T cell and 4T memory cell embodiments, other types of existing logic circuits topologies can be formed by using the PET devices. For example, FIG. 10(a) is a schematic diagram illustrating an inverter 1000 using two PETs. A high voltage at the input, $V_{in} \sim V_0$, turns OFF the PPET, which makes its resistance high. The same high voltage turns ON the bottom NPET, which makes its resistance low. The two resistances in series between the source $V_0$ and ground cause the output voltage, $V_{out}$, to be low. Similarly, a low $V_{in} \sim 0$ leads to a high output $V_{out} \sim V_0$. Ratios of $V_{out}/V_0$ versus $V_i/V_0$ are shown in the graph of FIG. 10(b) for two values of μ. Although the PET-based inverter 1000 operates similarly in principle with respect to an FET-based inverter, whereas the FET has source/drain symmetry, the PET does not. Inverting the PR and common connections transforms the PET inverter into the flip-flop, which is not possible in the FET case.

Figure 11A:
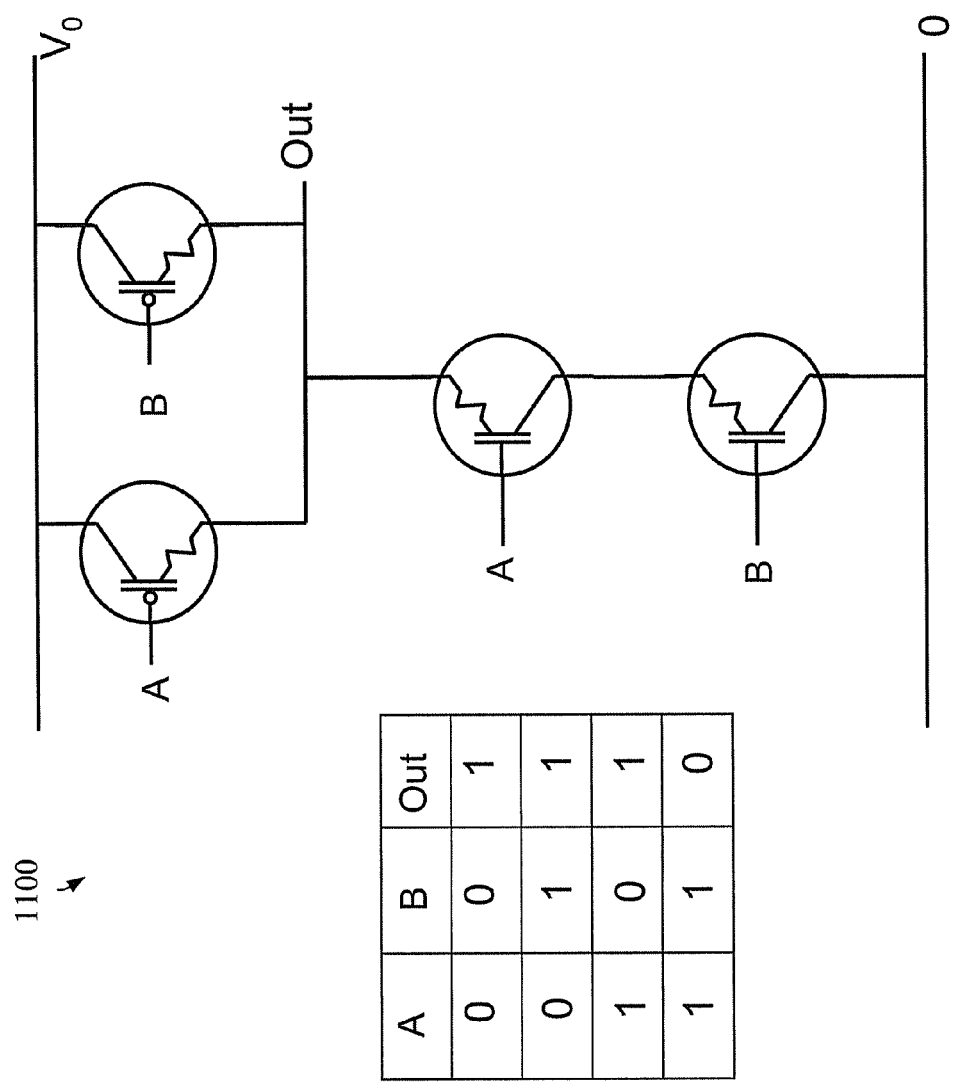
FIG. 11(a) is a schematic diagram of a PET-based NAND gate, in accordance with a further embodiment of the invention.
Figure 11B:
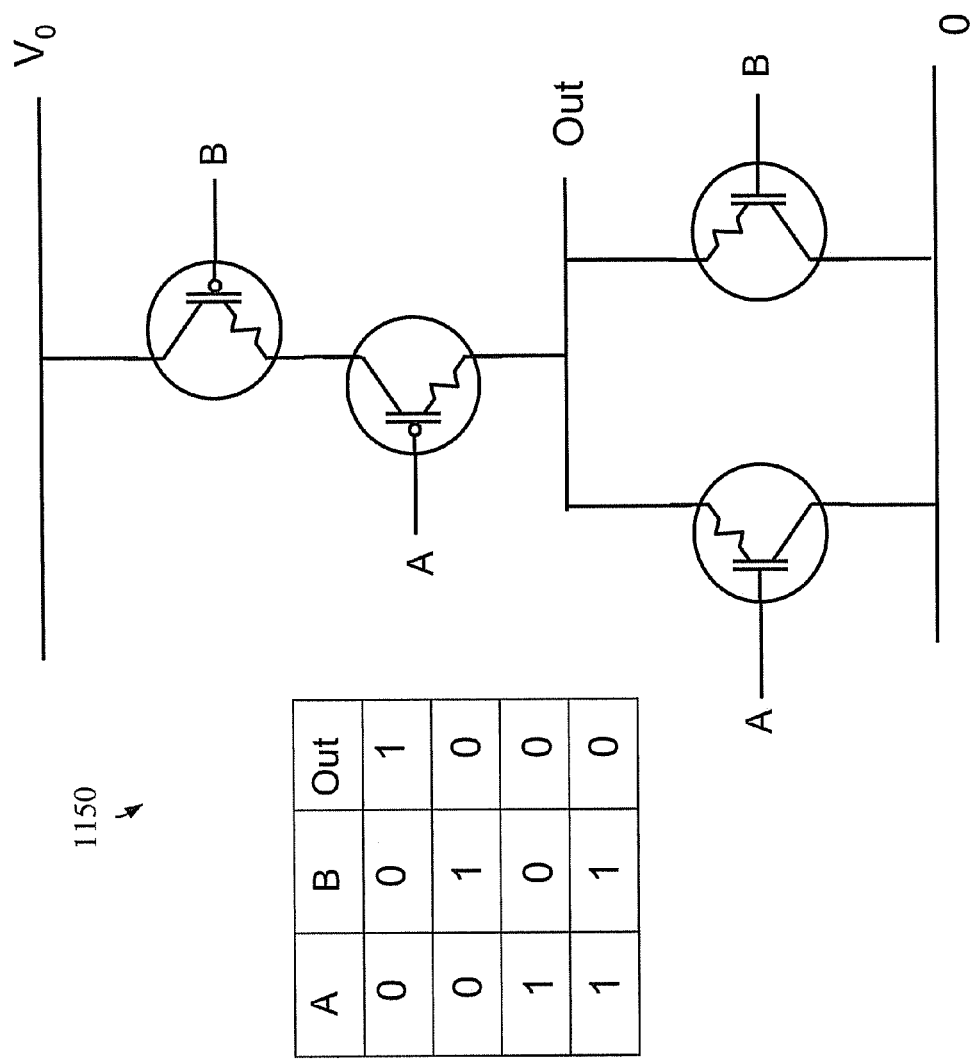
FIG. 11(b) is a schematic diagram of a PET-based NOR gate, in accordance with a further embodiment of the invention.

Additional basic PET-based logic gates are illustrated in FIGS. 11(a) and 11(b). In FIG. 11(a), the configuration for a NAND gate 1100 will be recognized. The NAND gate 1100 has a high output voltage ($\sim V_0$) only when both voltages at A and B are high. Otherwise, it has a low output voltage ($\sim 0$). If either A or B are low, then the respective PPET in the upper portion of the circuit is ON because the voltage drop across the PE is large and thus the resistance in the PR is low. Low resistance in either A or B causes the resistance in the top part of the circuit to be low. At the same time, at least one of A or B will be low in the bottom part of the circuit, and thus at least one NPET will be OFF, causing its resistance to be high. High resistance in either A or B causes the resistance in the bottom part of the circuit to be high. A low A or B voltage causes a low resistance in the top part of the circuit and a high resistance in the bottom part, and this makes the output voltage high. Only where A and B are both high will the total resistance in the top part of the circuit be high (as both of the PPETs are OFF) and the total resistance in the bottom part of the circuit be low (as both of the NPETs are ON). In that case, the output voltage will be low.

In FIG. 11(b), the configuration for a PET-based NOR gate 1150 will be recognized. In view of the description of the PET-based NAND gate 1100, one skilled in the art will also appreciate the operation of a PET-based NOR gate.

Advantages

As will thus be appreciated, piezo-effect transistors (PETs) have significant advantages over conventional FET transistors. For one, PETs are highly scalable, as the structures are simple, and many FET scaling problems are absent. There are no short-channel effects, as the input is screened from the output by the common electrode. The PET does not have a dopant nonuniformity problem. Moreover, the PET has a low impedance in its ON state as carrier transport is enhanced by the favorable geometry, wherein current flows transversely through the thin channel film (instead of longitudinally as in the FET). PETs should also be less impurity and geometry sensitive than FETs due to short mean free paths and efficient screening. In certain embodiments, a PET SRAM has only one half the transistor count of a corresponding FET SRAM. Furthermore, a PET manufacture process allows for multiple layers of devices, since there is no requirement for a high-mobility monocrystalline substrate. In principle, the PET can operate at low voltages as there is no intrinsic limitation on voltage, the piezo device is linear, and PR behavior is limited only by material properties.

The PET may be used in general computing applications. The sound propagation delay of a few picoseconds appears to be a main limitation on speed. Speed competitiveness needs to be judged in the context of actual achievable speed in the next litho technology generation. Due to its low ON output impedance the PET (even in the minimal device configuration) can sustain a high fanout, which can probably be used in a logic redesign approach to mitigate the intrinsic sound propagation delay.

The PET has clear advantages in the power driver context due to its low impedance. Examples include, but are not limited to, driving long wires, programming PCM memory, and control of static power in temporarily unused circuit blocks by switching off the power supply thereto.

With optimization of PR and PE materials to increase the gain μ, there is the possibility to reduce voltage and thus power/heat, which goes as the square of the voltage. The PET is not limited by the constraints which make it very difficult to further reduce FET voltages.

Simulation of the Pressure Cell

Figure 12B:
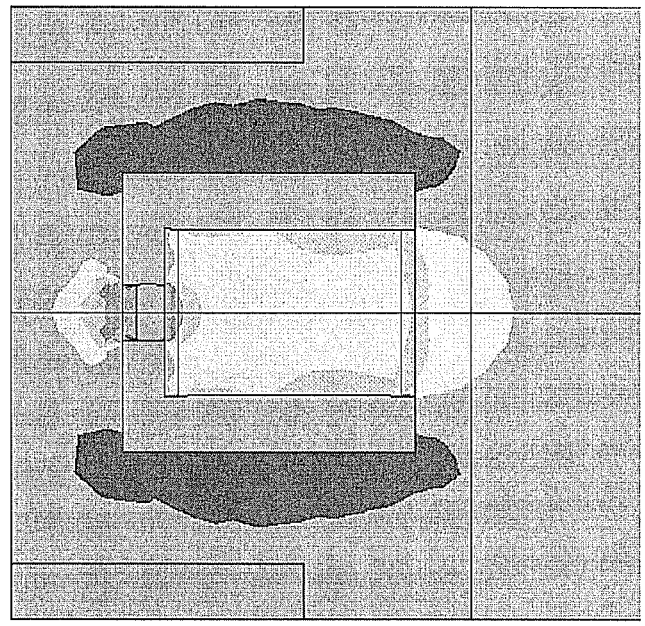
FIGS. 12(a)-(c) illustrate a mechanical software pressure simulation for an exemplary PET device.
Figure 12A:
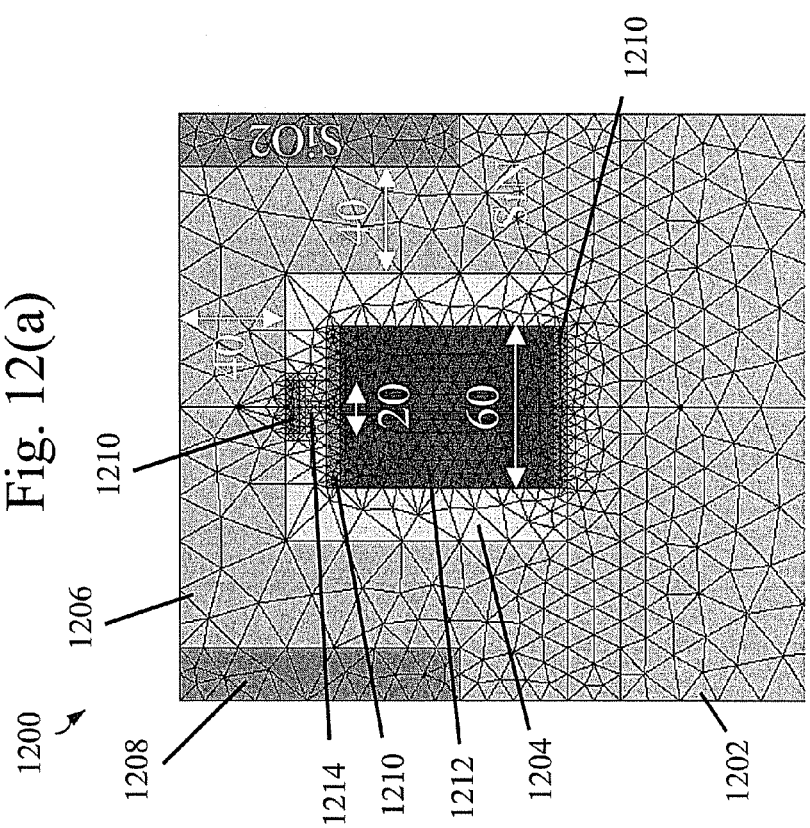

Referring now to FIG. 12(a) there is shown an exemplary PET configured for a mechanical simulation, using the engineering simulation software from ANSYS, Inc. Distances shown in FIG. 12(a) are in nanometers. In addition to the 5-layer structure of the memory cell itself (e.g., as shown in FIG. 4), the simulated structure 1200 also includes a silicon substrate 1202, a soft spacer material (e.g., SiCOH or other process-compatible soft material) buffer structure 1204 surrounding the cell, a silicon nitride (SiN) clamp or yoke structure 1206 on the substrate 1202 surrounding the transistor, and silicon dioxide ($SiO_2$) regions 1208 within the SiN clamp structure 1206. The simulation material for the three metal layers 1210 of the cell structure is tungsten (W), and the simulation material for the PE material 1212 is Lead Zirconate Titanate (PZT-5A), with $d_{33}$=0.37 nm/V. The dimensions are defined by $t_{PE}$=80 nm, $t_{PR}$=10 nm, $A_{PE}$=3600 nm$^2$, $A_{PR}$=400 nm$^2$.

The nitride clamp structure 1206 forms a rigid frame so that the electrically induced displacement of the PE material 1212 is mechanically coupled to (and focused primarily towards) the PR material 1214. Tungsten forms the conducting electrodes (leads not shown), and is also mechanically rigid, while the low-K buffer structure 1204 (being a soft material) does not impede the operating displacements significantly.

Figure 12C:

FIG. 12(b) shows the stress distribution of the simulated structure 1200 when 1.6 V is applied to the PE material 1212 with a resulting electric field of 0.02 V/nm. It is noted that a contraction (positive pressure) of the PE element 1212 results in an expansion (negative pressure) of the PR element 1214 and vice-versa. It will be seen from FIG. 12(b) that the PE material 1212 contracts at its sides (due to its Poisson ratio), and exerts pressure at both the top and bottom sides thereof due to its voltage-induced expansion. Due to some degree of force concentration, the highest pressure is in the PR material 1214, as reflected in FIG. 12(b), and the pressure legend of FIG. 12(c).

Figure 13:
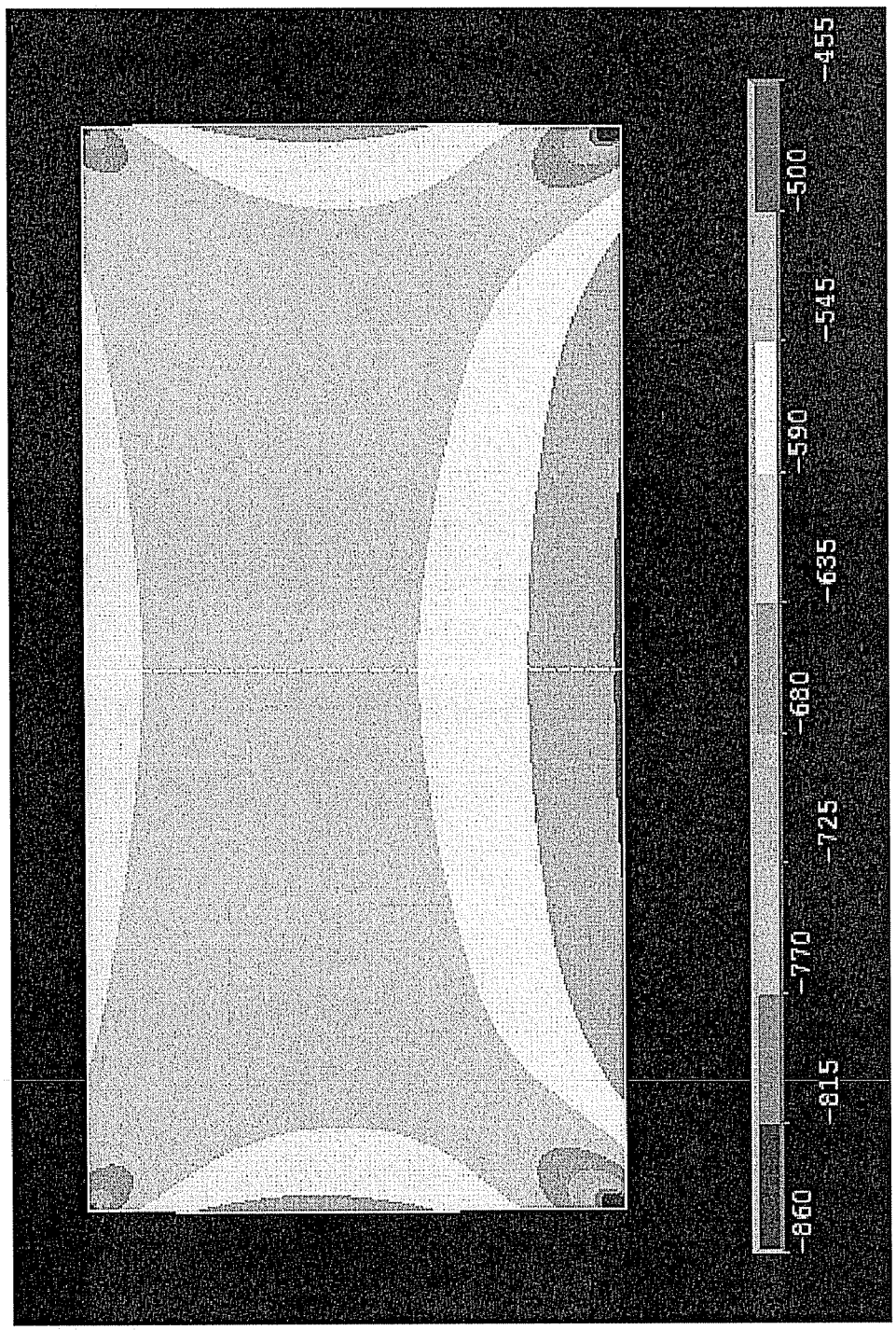
FIG. 13 is a more detailed view of the simulated pressure distribution within the PR material.
Figure 14:
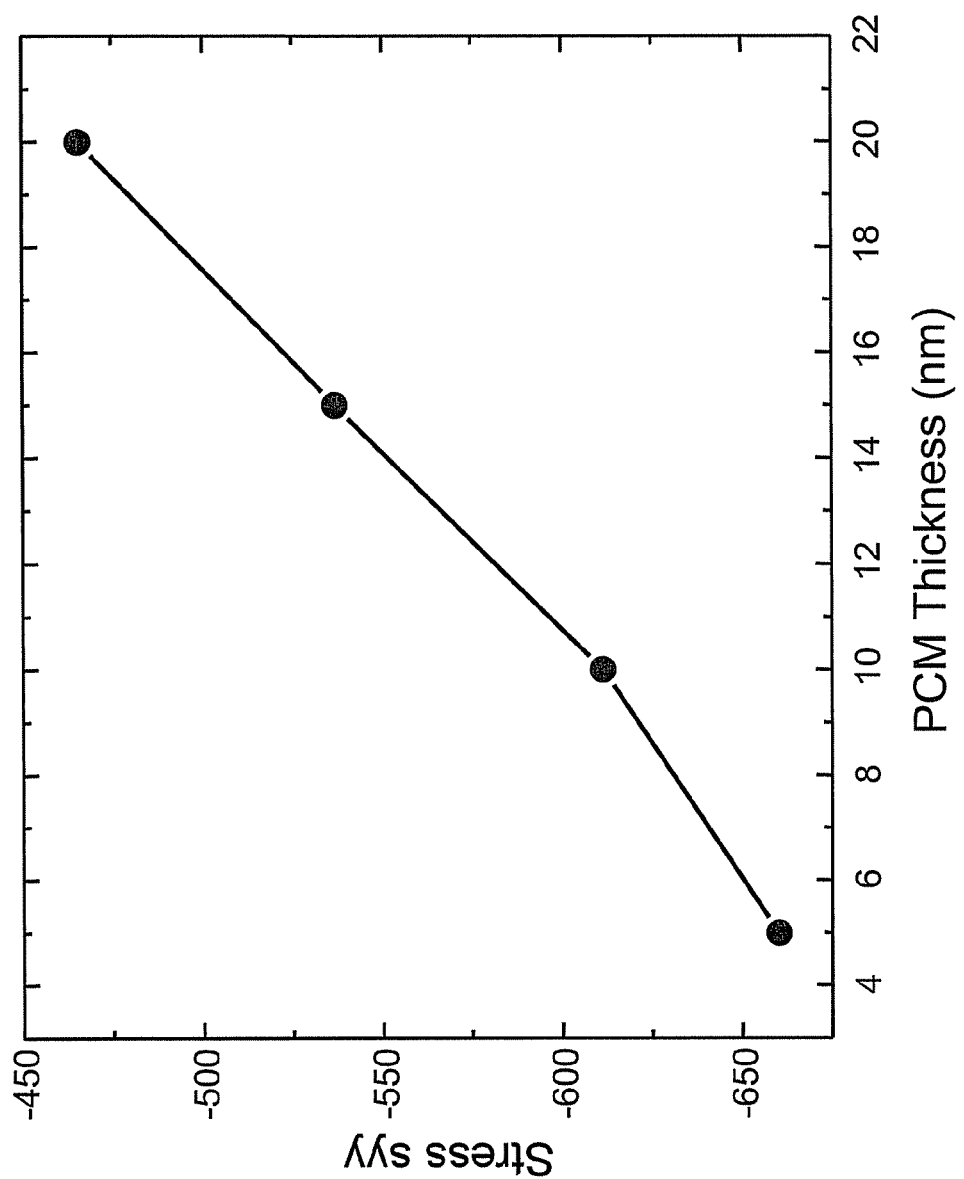
FIG. 14 is a graph illustrating the dependence of pressure on PR material thickness.

FIG. 13 is a more detailed view of the simulated pressure distribution within the PR material. As will be noted, the pressure is seen to be fairly uniform therein, and on the order of about 0.6 GPa. FIG. 14 is a graph illustrating the dependence of this pressure on PR material thickness, which is not critical. If the results are scaled to a PE material with $d_{33}$=0.94 nm/V, pressure of 1.5 GPA, in the acceptable regime, is obtained.

Physical Implementation and Manufacture

Figure 15E:
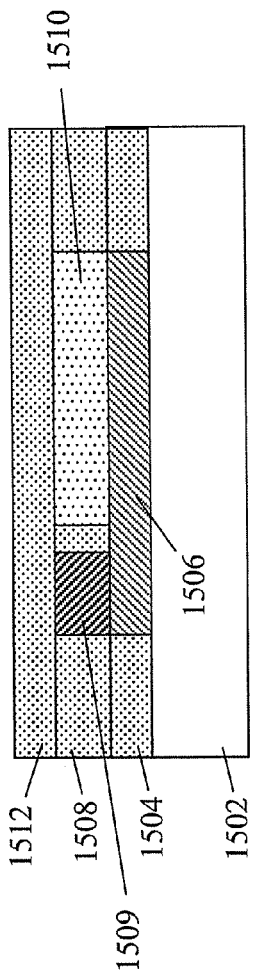

FIGS. 15(a) through 15(h) are cross sectional views illustrating an exemplary method of forming a PET device. As shown in FIG. 15(a), a substrate 1502 (e.g., silicon) has a dielectric layer 1504 (e.g., SiO$_2$) deposited thereon. The dielectric layer 1504 is lithographically patterned and etched to create an opening for the subsequent formation of a bottom metal contact 1506 (e.g., titanium nitride, tungsten, etc.), as shown in FIG. 15(b). Then, in FIG. 15(c), another dielectric layer 1508 is formed over the bottom metal contact 1506, and then patterned and etched so as to form a via filled with a first metal level (M1) stud 1509 (e.g., W, Cu). The stud 1509 may further include any suitable metal that also acts as an effective diffusion barrier (e.g., TiN, ZrN, RuO$_2$, etc.) to prevent any oxygen (or other element) diffusion from the subsequently formed piezoelectric layer, as well as have a functional role in the device operation.

Figure 15F:
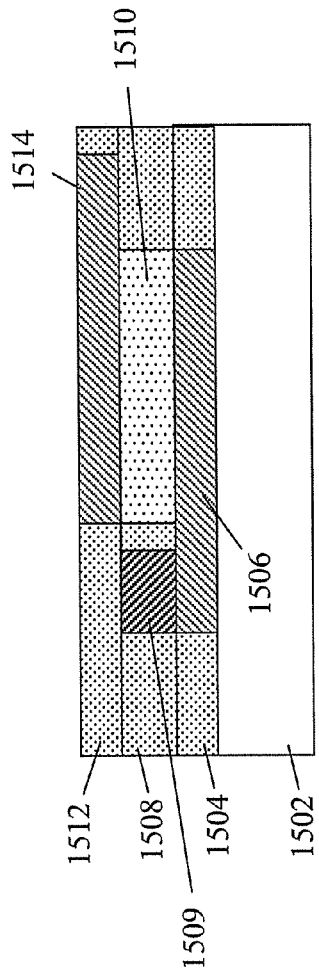

FIG. 15(d) illustrates the formation of the piezoelectric (PE) layer 1510 (e.g., PSZT) within dielectric layer 1508 and atop the bottom metal contact 1506. The PE layer formation may be by a blanket layer, by part of via fill prior to planarization, or by an extra patterning and etch step to form a discrete piezoelectric pad, for example. In addition, polling of the PE layer may 1506 be implemented at this point. Next, another dielectric layer 1512 is formed over the PE layer 1510 and M1 stud 1509 in FIG. 15(e), after which the dielectric layer 1512 is patterned, etched, and filled to form a middle metal contact 1514 to the top surface of the PE element 1510, as shown in FIG. 15(f). Still another dielectric layer 1516 is then deposited over the middle metal contact 1514 in FIG. 15(g). The dielectric layer 1516 is first patterned and etched to form a via that is filled with a second metal level (M2) contact stud 1518, similar to M1 stud 1509, that contacts the top of the middle metal contact 1514, and which also may include a diffusion barrier layer.

Figure 15G:
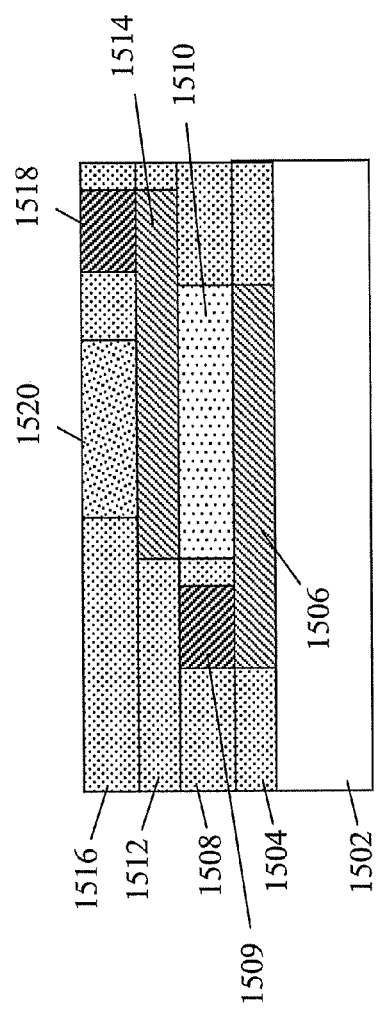

As further shown in FIG. 15(g), the dielectric layer 1516 is again patterned and etched to form an opening filled by a metal/barrier layer (e.g., TiN), not shown, and a PR (e.g., SmSe, SmS, etc.) stack 1520. The PR 1520 or a metal/PR stack may also include an intervening liner layer to the PR material (such as Ti, for example) to ensure good mechanical adhesion. This level may be planarized prior to the deposition of a top contact to the piezoresistor.

Figure 15H:
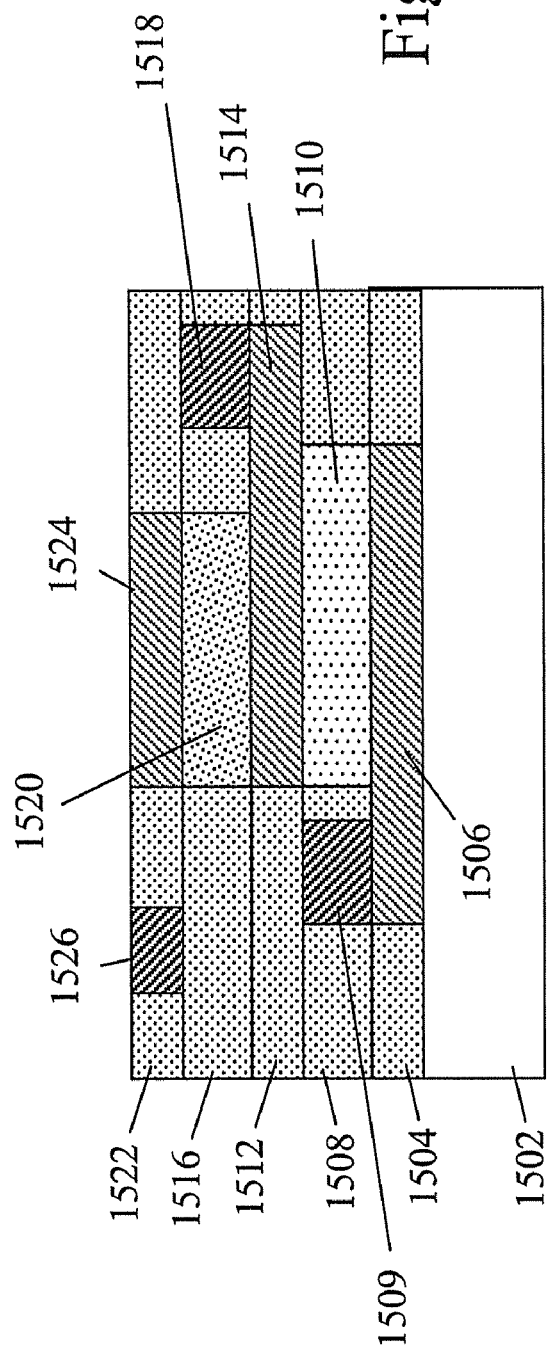

Finally, FIG. 15(h) illustrates the deposition of another dielectric layer 1522, after which a via is opened and then filled with an adhesion layer/metal stack (e.g. Ti/TiN) serving as a top metal contact 1524 to the PR element 1520 underneath. Similar to lower levels, this level may be planarized before forming an M3 level stud 1526. It should be noted that, where needed, a thin adhesion layer (e.g., a Ti layer of a few nanometers in thickness) adjacent to the PR element 1520 may be implemented in the various levels. In addition, optimization of the pressure may dictate surrounding the piezoelectric-piezoresistor stack with a suitable material with large Young's modulus, e.g., tungsten, in order to constrain the deformation of the stack.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A piezo-effect transistor (PET) device, comprising:
a piezoelectric (PE) material disposed between first and second electrodes; and
a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

2. The PET device of claim 1, wherein the PR material comprises one or more of: samarium selenide (SmSe), samarium sulfide (SmS), ZnODEP, EuNiO$_3$, Ni(S,Se), InSb, hexagonal BaTiO$_{3-\delta}$, and (2,5 DM-DCNQI)$_2$Cu.

3. The PET device of claim 1, wherein the PE material comprises one or more of: zirconate-titanate (PZT), strontium-doped lead-zirconate-titanate (PSZT), PSN—PMN—PNN—PSZT, PZNT 91/9 and PMNT 70/30.

4. The PET device of claim 1, wherein the PR material is rendered in a conductive state by application of a positive voltage between the gate terminal and the common terminal so as to comprise an n-type PET (NPET).

5. The PET device of claim 1, wherein the PR material is rendered in a conductive state by application of a negative voltage between the gate terminal and the common terminal so as to comprise an p-type PET (PPET).

6. The PET device of claim 1, further comprising:
a rigid clamp structure surrounding the PE material, PR material, first second, and third electrodes;

wherein the rigid clamp structure mechanically couples electrically induced displacement of the PE material to the PR material.

7. The PET device of claim 6, wherein the rigid clamp structure comprises silicon nitride (SiN).

8. The PET device of claim 6, further comprising a spacer material disposed between the rigid clamp structure and the PE material, PR material, first second, and third electrodes.

9. The PET device of claim 8, wherein the spacer material comprises SiCOH.

10. A piezo-effect, electronic memory storage element, comprising:
a first piezo-effect transistor (PET) device coupled to a second PET device in a latch configuration, with the first and second PET devices each comprising a piezoelectric (PE) material disposed between first and second electrodes, a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

11. The memory storage element of claim 10, wherein the first PET device comprises an n-type PET (NPET) such that the PR material thereof is rendered in a conductive state by application of a positive voltage between the gate terminal thereof and the common terminal thereof, and wherein the second PET device comprises a p-type PET (PPET) such that the PR material thereof is rendered in a conductive state by application of a negative voltage between the gate terminal thereof and the common terminal thereof.

12. The memory storage element of claim 11, wherein the gate terminal of the NPET is coupled to a high voltage supply rail, the gate terminal of the PPET is coupled to a low voltage supply rail, the output terminal of the NPET is coupled to the low voltage supply rail, the output terminal of the PPET is coupled to the high voltage supply rail, and the common terminals of the NPET and the PPET are coupled to one another, the common terminal corresponding to the data terminal of the latch configuration.

13. The memory storage element of claim 12, further comprising a third PET coupled to the data terminal, the third PET configured for implementing both a read and a write operation for the latch configuration so as to define a three transistor (3T) memory cell.

14. The memory storage element of claim 13, wherein the third PET comprises an NPET having the gate terminal thereof controlled by a row enable signal, the output terminal thereof coupled to the data terminal of the latch configuration and the common terminal thereof coupled to a data write and sense line.

15. The memory storage element of claim 14, wherein the high voltage supply rail has a positive voltage, of magnitude v, above ground potential and the low voltage supply has a negative voltage, of magnitude –v, below ground potential.

16. The memory storage element of claim 15, wherein the latch configuration is isolated by maintaining the row enable signal at –v potential and the data write and sense line at ground potential.

17. The memory storage element of claim 15, wherein data is written to the latch configuration is written to by applying a voltage corresponding to the data to the data write and sense line and pulsing the row enable signal to a potential of about 3 v.

18. The memory storage element of claim 15, wherein data is read from the latch configuration by grounding the data write and sense line while pulsing the row enable signal to a potential of about 3 v, and thereafter determining whether the data write and sense line is caused to charge toward either v or –v potential.

19. The memory storage element of claim 12, further comprising a third PET and a fourth PET coupled to the data terminal, the third PET configured for implementing a write operation for the latch configuration and the fourth PET configured for implementing a read operation for the latch configuration so as to define a four transistor (4T) memory cell.

20. The memory storage element of claim 19, wherein the third PET comprises an NPET having the gate terminal thereof controlled by a row enable signal, the output terminal thereof coupled to the data terminal of the latch configuration and the common terminal thereof coupled to a data write line, and wherein the fourth PET comprises a PPET having the gate terminal thereof coupled to the data terminal of the latch configuration, the common terminal thereof coupled to the row enable signal, and the output terminal thereof coupled to a data sense line.

21. The memory storage element of claim 20, wherein the high voltage supply rail has a positive voltage, of magnitude v, above ground potential and the low voltage supply has a negative voltage, of magnitude –v, below ground potential.

22. The memory storage element of claim 21, wherein the latch configuration is isolated by maintaining the row enable signal at –v potential and the data write and data sense lines at ground potential.

23. The memory storage element of claim 21, wherein data is written to the latch configuration by applying a voltage corresponding to the data to the data write line and pulsing the row enable signal to a potential of about 3 v.

24. The memory storage element of claim 21, wherein data is read from the latch configuration by maintaining the data write line at +v potential, grounding the data sense line while pulsing the row enable signal to a potential of about +v, and thereafter determining whether the data sense line is caused to charge toward +v or remain at potential.

25. A digital logic gate, comprising:
two or more piezo-effect transistor (PET) devices each comprising a piezoelectric (PE) material disposed between first and second electrodes, a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

26. The digital logic gate of claim 25, wherein at least one of the two or more PET devices comprises an n-type PET (NPET) such that the PR material thereof is rendered in a conductive state by application of a positive voltage between the gate terminal thereof and the common terminal thereof, and at least another of the two or more PET devices comprises a p-type PET (PPET) such that the PR material thereof is rendered in a conductive state by application of a negative voltage between the gate terminal thereof and the common terminal thereof.

27. The digital logic gate of claim 26, wherein the gate comprises a two transistor (2T) inverter device.

28. The digital logic gate of claim 26, wherein the gate comprises a four transistor (4T) NOR gate device.

29. The digital logic gate of claim 26, wherein the gate comprises a four transistor (4T) NAND gate device.

30. A method of forming a piezo-effect transistor (PET) device, the method comprising:
forming a first electrode;
forming a piezoelectric (PE) material over the first electrode;
forming a second electrode over the PE material;
forming a piezoresistive (PR) material over the second electrode; and
forming a third electrode over the PR material;
wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material.

31. The method of claim 30, wherein the PR material comprises one or more of: samarium selenide (SmSe), samarium sulfide (SmS), ZnODEP, $EuNiO_3$, Ni(S,Se), hexagonal $BaTiO_{3-\delta}$, and $(2,5\ DM\text{-}DCNQI)_2Cu$.

32. The method of claim 30, wherein the PE material comprises one or more of: zirconate-titanate (PZT), strontium-doped lead-zirconate-titanate (PSZT), PSN—PMN—PNN—PSZT, PZNT 91/9 and PMNT 70/30.

* * * * *